(12) United States Patent
Na et al.

(10) Patent No.: US 12,327,759 B2
(45) Date of Patent: Jun. 10, 2025

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Sang Cheol Na, Seoul (KR); Ki Chul Park, Suwon-si (KR); Seo Woo Nam, Seoul (KR); Dong Ick Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 639 days.

(21) Appl. No.: 17/650,045

(22) Filed: Feb. 4, 2022

(65) Prior Publication Data

US 2022/0399229 A1    Dec. 15, 2022

(30) Foreign Application Priority Data

Jun. 14, 2021    (KR) .................. 10-2021-0076707

(51) Int. Cl.
| | | |
|---|---|---|
| *H01L 23/48* | (2006.01) | |
| *H01L 21/768* | (2006.01) | |
| *H01L 23/522* | (2006.01) | |
| *H01L 23/532* | (2006.01) | |

(52) U.S. Cl.
CPC .. *H01L 21/76834* (2013.01); *H01L 21/76877* (2013.01); *H01L 23/5226* (2013.01); *H01L 23/53295* (2013.01)

(58) Field of Classification Search
CPC ..................... H01L 23/5226; H01L 23/53295
USPC ................................................ 257/774, 758
See application file for complete search history.

(56) References Cited

U.S. PATENT DOCUMENTS

| | | | | |
|---|---|---|---|---|
| 6,023,102 A | * | 2/2000 | Nguyen | ............ H01L 21/76807 |
| | | | | 257/E21.582 |
| 6,077,774 A | * | 6/2000 | Hong | ................ H01L 21/76834 |
| | | | | 438/645 |
| 7,368,377 B2 | | 5/2008 | Whelan et al. | |
| 8,405,215 B2 | * | 3/2013 | Yang | ................. H01L 21/76805 |
| | | | | 257/E23.141 |
| 8,835,305 B2 | * | 9/2014 | Yang | ................. H01L 23/53295 |
| | | | | 257/760 |

(Continued)

FOREIGN PATENT DOCUMENTS

| | | |
|---|---|---|
| KR | 10-0363696 | 12/2002 |
| KR | 10-2020-00298 | 3/2020 |

*Primary Examiner* — Nitin Parekh
(74) *Attorney, Agent, or Firm* — Wolf, Greenfield & Sacks, P.C.

(57) ABSTRACT

A semiconductor device includes a substrate, a first interlayer insulating layer on the substrate, a lower wiring pattern inside the first interlayer insulating layer, an etch stop layer on the first interlayer insulating layer, a second interlayer insulating layer on the etch stop layer, a via trench inside the second interlayer insulating layer and the etch stop layer and that extends to the lower wiring pattern, a via inside the via trench and that is in contact with the second interlayer insulating layer and is formed of a single film, an upper wiring trench formed inside the second interlayer insulating layer on the via, and an upper wiring pattern inside the upper wiring trench and that includes an upper wiring barrier layer and an upper wiring filling layer on the upper wiring barrier layer An upper surface of the via is in contact with the upper wiring filling layer.

16 Claims, 28 Drawing Sheets

(56) References Cited

U.S. PATENT DOCUMENTS

| | | |
|---|---|---|
| 9,219,033 B2 | 12/2015 | Peng et al. |
| 9,418,889 B2 * | 8/2016 | Mountsier ........... H01L 21/0217 |
| 9,583,386 B2 | 2/2017 | Kolics et al. |
| 9,685,404 B2 * | 6/2017 | Bao ................... H01L 21/76805 |
| 9,728,503 B2 | 8/2017 | Peng et al. |
| 9,842,804 B2 | 12/2017 | Wang et al. |
| 9,876,968 B2 | 1/2018 | Kolics et al. |
| 10,164,018 B1 | 12/2018 | Yang et al. |
| 10,262,943 B2 | 4/2019 | Kolics et al. |
| 10,396,986 B2 | 8/2019 | Briggs et al. |
| 10,879,107 B2 | 12/2020 | Dutta et al. |
| 11,881,431 B2 * | 1/2024 | Park ................. H01L 21/76832 |
| 2004/0238961 A1 * | 12/2004 | Cunningham .... H01L 21/76855 |
| | | 257/E21.579 |
| 2008/0012135 A1 | 1/2008 | Park |
| 2015/0102461 A1 * | 4/2015 | Lee ....................... H10B 12/09 |
| | | 257/532 |
| 2021/0233805 A1 * | 7/2021 | Chen ................ H01L 21/76834 |

* cited by examiner

SEMICONDUCTOR DEVICE AND METHOD FOR FABRICATING THE SAME

CROSS-REFERENCE TO RELATED APPLICATION

This application claims priority under 35 U.S.C. 119 from Korean Patent Application No. 10-2021-0076707, filed on Jun. 14, 2021 in the Korean Intellectual Property Office, the contents of which are herein incorporated by reference in their entirety.

1. Technical Field

Embodiments of the present disclosure are directed to a semiconductor device and a method for fabricating the same.

2. Discussion of the Related Art

As semiconductor elements have been down scaled in recent years, semiconductor chips have become more highly integrated and use less power. A gap between circuit components such as wirings gradually decreases, which can cause an increase in resistance between the wiring and a via. Research is being conducted to reduce the increase in resistance between the wiring and the via to improve reliability of the semiconductor device.

SUMMARY

Embodiments of the present disclosure provide a semiconductor device and a method for fabricating the semiconductor in which an upper wiring barrier layer is not formed on an upper surface of a via by forming a protective layer on the upper surface of the via in the process of forming an upper wiring pattern. As a result, a contact resistance between the upper wiring pattern and the via is reduced to increase the reliability of the semiconductor device.

According to an exemplary embodiment of the present disclosure, there is provided a semiconductor device that includes a substrate, a first interlayer insulating layer disposed on the substrate, a lower wiring pattern disposed inside the first interlayer insulating layer, an etch stop layer disposed on the first interlayer insulating layer, a second interlayer insulating layer disposed on the etch stop layer, a via trench formed inside the second interlayer insulating layer and the etch stop layer, where the via trench extends to the lower wiring pattern, a via disposed inside the via trench, where the via is in contact with the second interlayer insulating layer and is formed of a single film, an upper wiring trench formed inside the second interlayer insulating layer and on the via, and an upper wiring pattern disposed inside the upper wiring trench, wherein the upper wiring pattern includes an upper wiring barrier layer and an upper wiring filling layer disposed on the upper wiring barrier layer. An upper surface of the via is in contact with the upper wiring filling layer.

According to an exemplary embodiment of the present disclosure, there is provided a semiconductor device that includes a substrate, a first interlayer insulating layer disposed on the substrate, a lower wiring pattern disposed inside the first interlayer insulating layer, a second interlayer insulating layer disposed on the first interlayer insulating layer, a via trench formed inside the second interlayer insulating layer, where the via trench extends to the lower wiring pattern, a via that completely fills the via trench and is in contact with the second interlayer insulating layer, an upper wiring trench formed inside the second interlayer insulating layer and on the via, and an upper wiring pattern disposed inside the upper wiring trench, where the upper wiring pattern includes an upper wiring barrier layer and an upper wiring filling layer disposed on the upper wiring barrier layer. The via does not overlap the upper wiring barrier layer in a vertical direction.

According to an exemplary embodiment of the present disclosure, there is provided a method for fabricating a semiconductor device. The method includes the steps of forming a lower wiring pattern and a first interlayer insulating layer that surrounds the lower wiring pattern on a substrate, forming an etch stop layer on the first interlayer insulating layer, forming a second interlayer insulating layer on the etch stop layer, forming a via trench inside the second interlayer insulating layer, wherein the via trench exposes the lower wiring pattern, forming a via inside the via trench, wherein the via is in contact with the second interlayer insulating layer, forming a protective layer on an upper surface of the via, forming an upper wiring barrier layer on a side wall of the protective layer, removing the protective layer, and forming an upper wiring filling layer on the upper surface of the via and the upper wiring barrier layer. The via is formed of a single film, and the upper surface of the via is in contact with the upper wiring filling layer between the upper wiring barrier layers.

According to an exemplary embodiment of the present disclosure, there is provided a method for fabricating a semiconductor device. The method includes the steps of forming a lower wiring pattern and a first interlayer insulating layer that surrounds the lower wiring pattern on a substrate; forming an etch stop layer on the first interlayer insulating layer; forming a second interlayer insulating layer on the etch stop layer; forming a via trench inside the second interlayer insulating layer, wherein the via trench penetrates the etch stop layer and exposes the lower wiring pattern; forming a via inside the via trench wherein the via fills the trench; forming a protective layer on the upper surface of the via; forming an upper wiring barrier layer on the upper surface of the second interlayer insulating layer and the side wall of the protective layer but not the upper surface of the protective layer; removing the protective layer wherein the upper surface of the via is exposed between the upper wiring barrier layers; forming an upper wiring filling layer and an upper wiring capping pattern on the upper surface of the via and the upper wiring barrier layer; and patterning the upper wiring barrier layer, the upper wiring filling layer, and the upper wiring capping pattern wherein an upper wiring pattern is formed.

However, features of the present disclosure are not restricted to the those set forth herein. The above and other features of the present disclosure will become more apparent to one of ordinary skill in the art to which the present disclosure pertains by referencing the detailed description of embodiments of the present disclosure given below.

DETAILED DESCRIPTION OF THE EMBODIMENTS

Hereinafter, a semiconductor device according to some embodiments of the present disclosure will be described referring to FIGS. 1 and 2.

Figure 1:
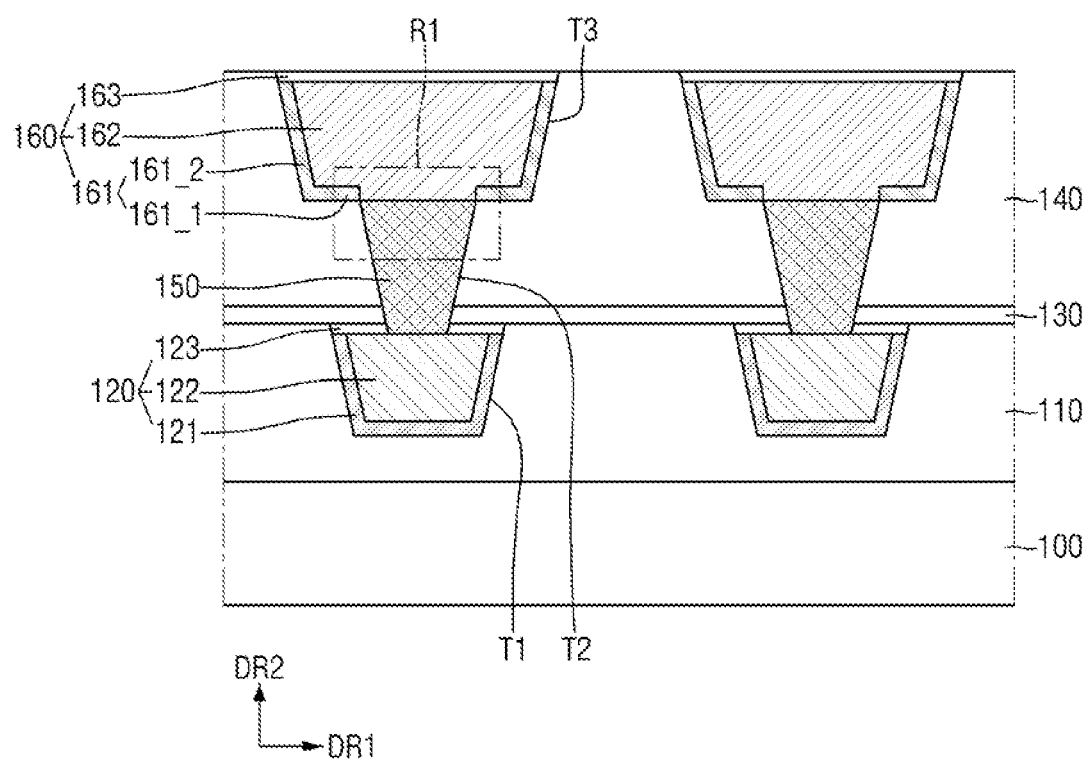
FIG. 1 illustrates a semiconductor device according to some embodiments of the present disclosure.

FIG. 1 illustrates a semiconductor device according to some embodiments of the present disclosure. FIG. 2 is an enlarged view of a region R1 of FIG. 1.

Figure 2:
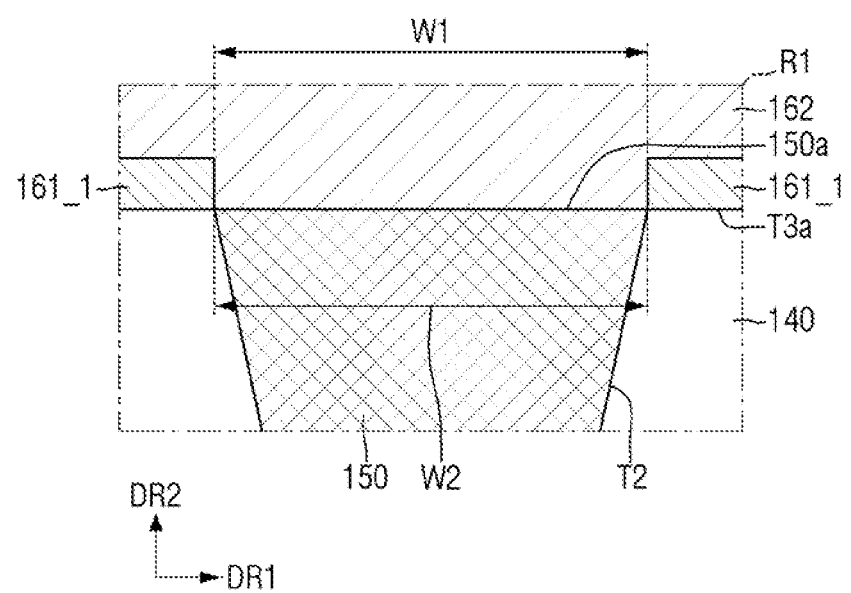
FIG. 2 is an enlarged view of a region R1 of FIG. 1.

Referring to FIGS. 1 and 2, a semiconductor device according to some embodiments of the present disclosure includes a substrate 100, a first interlayer insulating layer 110, a lower wiring pattern 120, an etch stop layer 130, a second interlayer insulating layer 140, a via 150, and an upper wiring pattern 160.

In an embodiment, the substrate 100 has a structure in which a base substrate and an epitaxial layer are stacked, however, embodiments of the present disclosure are not limited thereto. The substrate 100 may be a silicon substrate, a gallium arsenide substrate, a silicon germanium substrate, a ceramic substrate, a quartz substrate, or a glass substrate for display, etc., or may be an SOI (Semiconductor On Insulator) substrate.

In addition, the substrate 100 includes a conductive pattern. In an embodiment, the conductive pattern may be a metal wiring, a contact, etc., or may be a gate electrode of a transistor, a source/drain of the transistor, a diode, etc., however, embodiments of the present disclosure are not limited thereto.

The first interlayer insulating layer 110 is disposed on the substrate 100. The first interlayer insulating layer 110 includes, for example, at least one of silicon oxide, silicon nitride, silicon oxynitride, or a low dielectric constant material. The first interlayer insulating layer 110 may include a low dielectric constant material to reduce a coupling shape between the wirings.

A lower wiring trench T1 is formed inside the first interlayer insulating layer 110. The lower wiring trench T1 extends from an upper surface of the first interlayer insulating layer 110 toward the substrate 100.

The lower wiring pattern 120 is disposed inside the first interlayer insulating layer 110. The lower wiring pattern 120 is disposed inside the lower wiring trench T1. The lower wiring pattern 120 includes a lower wiring barrier layer 121, a lower wiring filling layer 122, and a lower wiring capping pattern 123.

The lower wiring barrier layer 121 is disposed on the bottom surface and side walls of the lower wiring trench T1. For example, the lower wiring barrier layer 121 is conformally formed in the lower wiring trench T1. The lower wiring barrier layer 121 includes, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), or niobium nitride (NbN), or combinations thereof. However, embodiments of the present disclosure are not limited thereto.

The lower wiring filling layer 122 is disposed on the lower wiring barrier layer 121 inside the lower wiring trench T1. The lower wiring filling layer 122 fills the interior of the lower wiring trench T1 on the lower wiring barrier layer 121. The lower wiring filling layer 122 include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), or rhodium (Rh). However, embodiments of the present disclosure are not limited thereto.

The lower wiring capping pattern 123 is disposed on the lower wiring barrier layer 121 and the lower wiring filling layer 122 inside the lower wiring trench T1. However, embodiments of the present disclosure are not limited thereto. In some embodiments, the lower wiring capping pattern 123 is disposed on the lower wiring filling layer 122 between the lower wiring barrier layers 121. The lower wiring capping pattern 123 includes, for example, at least one of cobalt (Co), ruthenium (Ru) or manganese (Mn). However, embodiments of the present disclosure are not limited thereto.

The etch stop layer 130 is disposed on the first interlayer insulating layer 110 and the lower wiring barrier layer 121. The etch stop layer 130 includes, for example, at least one of silicon nitride, silicon oxynitride, or silicon carbon nitride, etc. In some embodiments, the etch stop layer 130 includes a metal, such as aluminum (Al). However, embodiments of the present disclosure are not limited thereto.

The second interlayer insulating layer 140 is disposed on the etch stop layer 130. The second interlayer insulating layer 140 includes, for example, at least one of silicon oxide, silicon nitride, silicon oxynitride, or a low dielectric constant material. The second interlayer insulating layer 140 may include a low dielectric constant material to reduce the coupling shape between the wirings.

A via trench T2 is formed inside the second interlayer insulating layer 140 and the etch stop layer 130. The via trench T2 extends to the lower wiring pattern 120. For example, the via trench T2 penetrates the lower wiring capping pattern 123 and extends to the lower wiring filling layer 122. However, embodiments of the present disclosure are not limited thereto. In some embodiments, the via trench T2 extends to the lower wiring capping pattern 123 and exposes the upper surface of the lower wiring capping pattern 123.

A via 150 is disposed inside the via trench T2. In an embodiment, the via 150 completely fills the interior of the via trench T2. The side wall of the via 150 is in contact with the second interlayer insulating layer 140.

The via 150 is formed of a single film. That is, no barrier layer is disposed on the side wall of the via 150. The via 150 includes a material that differs from that of the lower wiring filling layer 122. The via 150 includes, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Jr), or rhodium (Rh). However, embodiments of the present disclosure are not limited thereto.

An upper wiring trench T3 is formed inside the second interlayer insulating layer 140. The upper wiring trench T3 extends from an upper surface of the second interlayer insulating layer 140 to an upper surface 150a of the via 150. A width of the upper wiring trench T3 in a horizontal direction DR1 is greater than a width of the via trench T2 in the horizontal direction DR1. For example, a lower surface T3a of the upper wiring trench T3 is formed on the same plane as the upper surface 150a of the via 150. However, embodiments of the present disclosure are not limited thereto.

The upper wiring pattern 160 is disposed inside the second interlayer insulating layer 140. The upper wiring pattern 160 is disposed inside the upper wiring trench T3. The upper wiring pattern 160 includes an upper wiring barrier layer 161, an upper wiring filling layer 162, and an upper wiring capping pattern 163.

The upper wiring barrier layer 161 is disposed on a bottom surface and side walls of the upper wiring trench T3. For example, the upper wiring barrier layer 161 is conformally formed in the upper wiring trench T3. The upper wiring barrier layer 161 does not overlap the via 150 in a vertical direction DR2. The upper wiring barrier layer 161 includes a first portion 161_1 and a second portion 161_2.

The first portion 161_1 of the upper wiring barrier layer 161 is disposed on the bottom surface of the upper wiring trench T3. The first portion 161_1 of the upper wiring barrier layer 161 is disposed on both sides of the via 150. That is, the upper surface 150a of the via 150 is exposed between the first portions 161_1 of the upper wiring barrier layer 161.

The second portion 161_2 of the upper wiring barrier layer 161 is disposed on the side wall of the upper wiring trench T3. The second portion 161_2 of the upper wiring barrier layer 161 is connected to the first portion 161_1 of the upper wiring barrier layer 161. The first portion 161_1 and the second portion 161_2 are integrally formed.

The upper wiring barrier layer 161 includes, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), or niobium nitride (NbN), or combinations thereof. However, embodiments of the present disclosure are not limited thereto.

The upper wiring filling layer 162 is disposed inside the upper wiring trench T3 on the upper wiring barrier layer 161 and the upper surface 150a of the via 150. The upper wiring filling layer 162 fills the interior of the upper wiring trench T3 on the first portion 161_1 of the upper wiring barrier layer 161 and the upper surface 150a of the via 150 and between the second portions 161_2 of the upper wiring barrier layer 161.

A part of the upper wiring filling layer 162 is disposed between the first portions 161_1 of the upper wiring barrier layer 161. The upper wiring filling layer 162 is in contact with the upper surface 150a of the via 150 between the first portions 161_1 of the upper wiring barrier layer 161. A width W1 in the horizontal direction DR1 of the upper wiring filling layer 162 disposed between the first portions 161_1 of the upper wiring barrier layer 161 is equal to a width W2 in the horizontal direction DR1 of the upper surface 150a of the via 150.

The upper wiring filling layer 162 includes a material that differs from that of the via 150. The upper wiring filling layer 162 includes at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), or rhodium (Rh). However, embodiments of the present disclosure are not limited thereto.

The upper wiring capping pattern 163 is disposed on the upper wiring barrier layer 161 and the upper wiring filling layer 162 inside the upper wiring trench T3. However, embodiments of the present disclosure are not limited thereto. In some embodiments, the upper wiring capping pattern 163 is disposed on the upper wiring filling layer 162 between the second portions 161_2 of the upper wiring barrier layer 161. The upper wiring capping pattern 163 includes, for example, at least one of cobalt (Co), ruthenium (Ru) or manganese (Mn). However, embodiments of the present disclosure are not limited thereto.

Hereinafter, a method for fabricating a semiconductor device according to some embodiments of the present disclosure will be described with reference to FIGS. 1 to 8.

FIGS. 3 to 8 are intermediate stage diagrams that illustrate a method for fabricating a semiconductor device according to some embodiments of the present disclosure.

Figure 3:
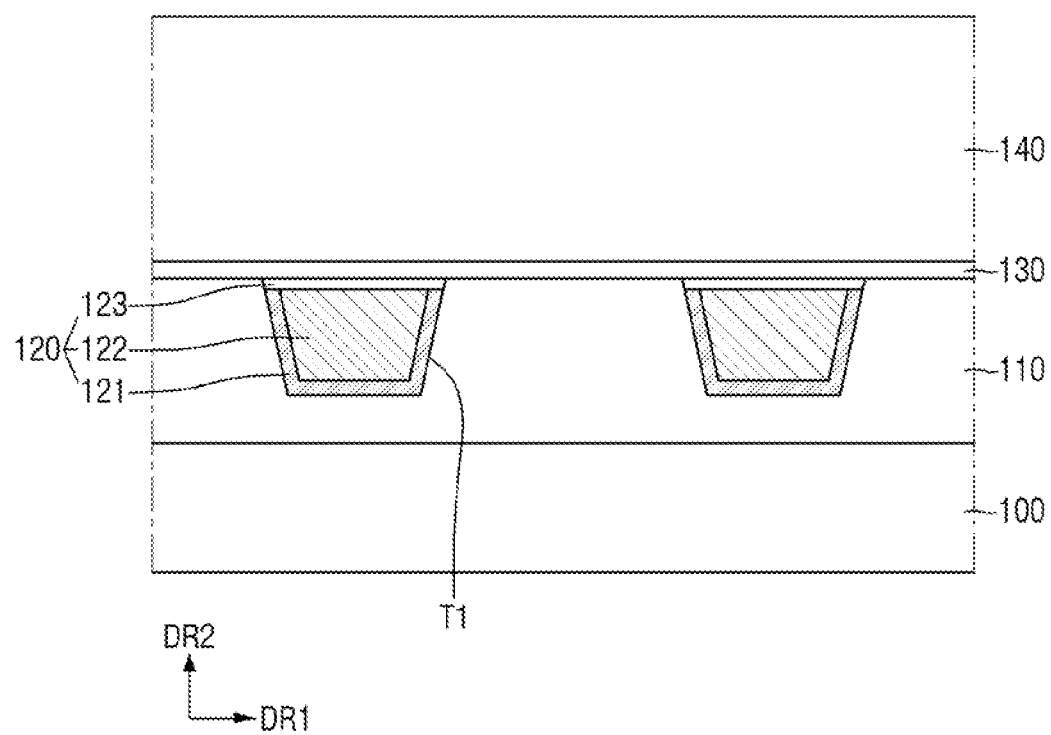
FIGS. 3 to 8 are intermediate stage diagrams that illustrate a method for fabricating a semiconductor device according to some embodiments of the present disclosure.

Referring to FIG. 3, in an embodiments, the first interlayer insulating layer 110 is formed on the substrate 100. Subsequently, the lower wiring trench T1 iua formed inside the first interlayer insulating layer 110. Subsequently, the lower wiring pattern 120 is formed inside the lower wiring trench T1.

The lower wiring pattern 120 includes a lower wiring barrier layer 121, a lower wiring filling layer 122, and a lower wiring capping pattern 123, which are sequentially formed inside the lower wiring trench T1. Subsequently, the etch stop layer 130 and the second interlayer insulating layer 140 are sequentially formed on the first interlayer insulating layer 110 and the lower wiring pattern 120.

Figure 4:
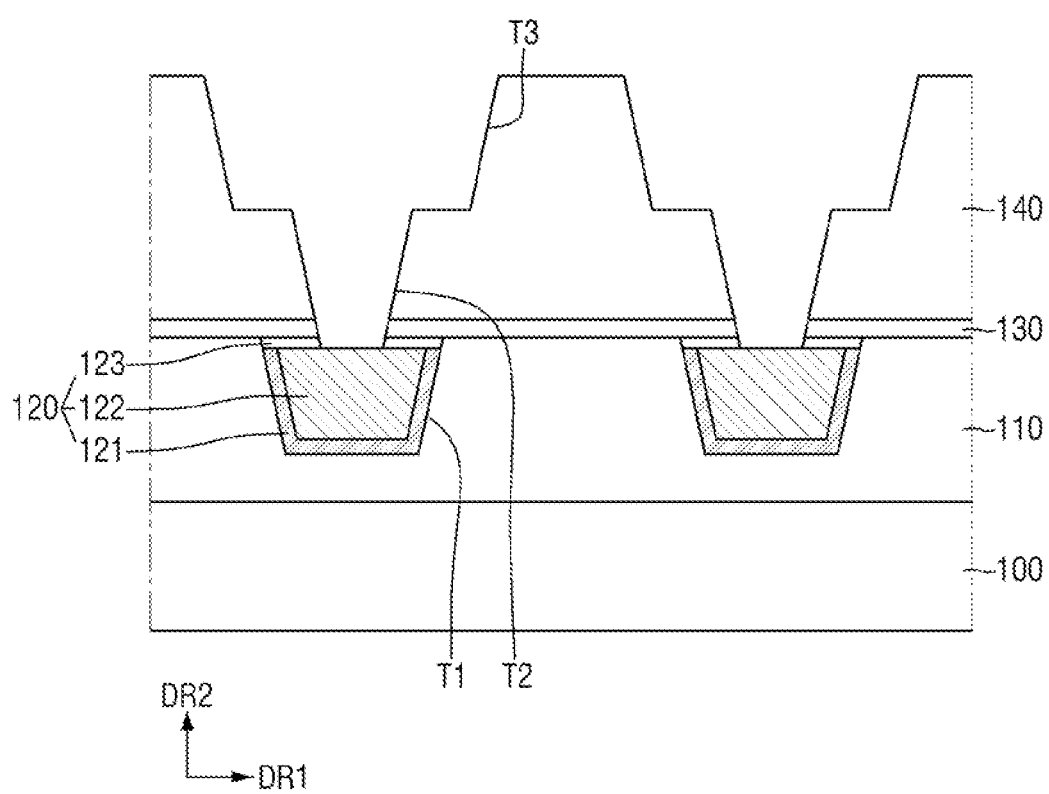

Referring to FIG. 4, in an embodiment, the upper wiring trench T3 and the via trench T2 are formed inside the second interlayer insulating layer 140. Specifically, the upper wiring trench T3, which extends from the upper surface of the second interlayer insulating layer 140 toward the lower wiring pattern 120, is formed. A lower surface of the upper wiring trench T3 is formed inside the second interlayer insulating layer 140.

Subsequently, the via trench T2, which extends from the lower surface of the upper wiring trench T3 toward the lower wiring pattern 120, is formed. The via trench T2 penetrates the etch stop layer 130 in the vertical direction DR2 and exposes the lower wiring pattern 120. For example, the via trench T2 penetrates the lower wiring capping pattern 123 in the vertical direction DR2 and exposes the lower wiring filling layer 122.

The via trench T2 overlaps the upper wiring trench T3 in the vertical direction DR2. The via trench T2 is surrounded by the upper wiring trench T3. The width of the upper wiring trench T3 in the horizontal direction DR1 is greater than the width of the via trench T2 in the horizontal direction DR1.

Figure 5:
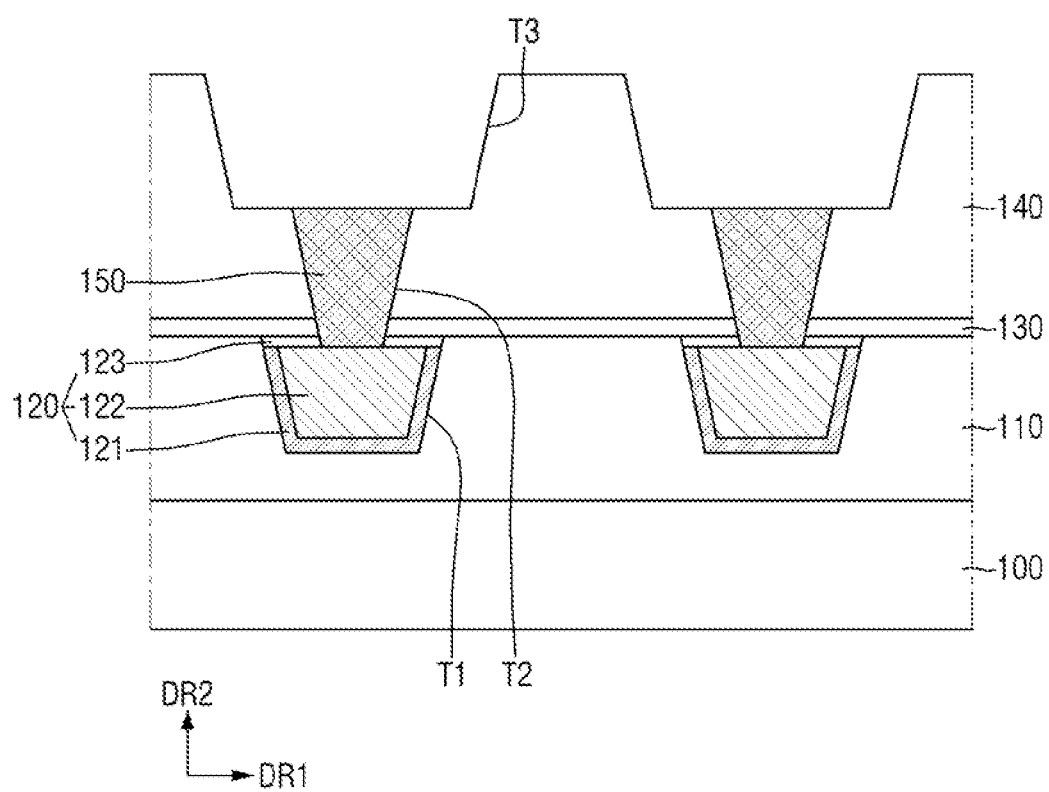

Referring to FIG. 5, in an embodiment, the via 150 is formed inside the via trench T2. In an embodiment, the via 150 completely fills the via trench T2. The via 150 is formed of a single film.

Figure 6:
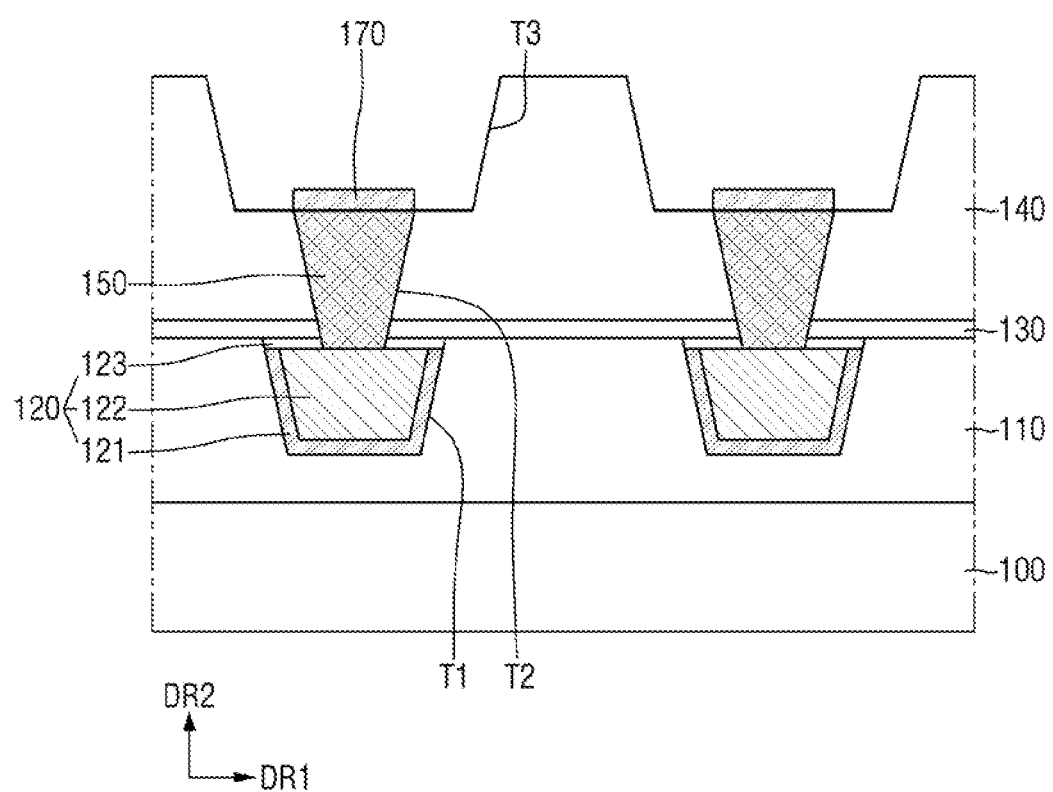

Referring to FIG. 6, in an embodiment, a protective layer 170 is formed on the upper surface of the via 150. In an embodiment, the protective layer 170 completely overlaps the upper surface of the via 150 in the vertical direction DR2. The width of the protective layer 170 in the horizontal direction DR1 is equal to the width of the upper surface of the via 150 in the horizontal direction DR1.

The protective layer 170 includes a head portion that is in contact with the upper surface of the via 150, and a tail portion that extends from the head portion into the interior of the upper wiring trench T3. The head portion of the protective layer 170 includes a material that easily adheres to the upper surface of the via 150. The head portion of the protective layer 170 includes, for example, a silicon oxide. The tail portion of the protective layer 170 includes a material to which an upper wiring barrier layer 161, which will be described below, is hard to adhere. The tail portion of the protective layer 170 includes, for example, a carbon element.

Figure 7:
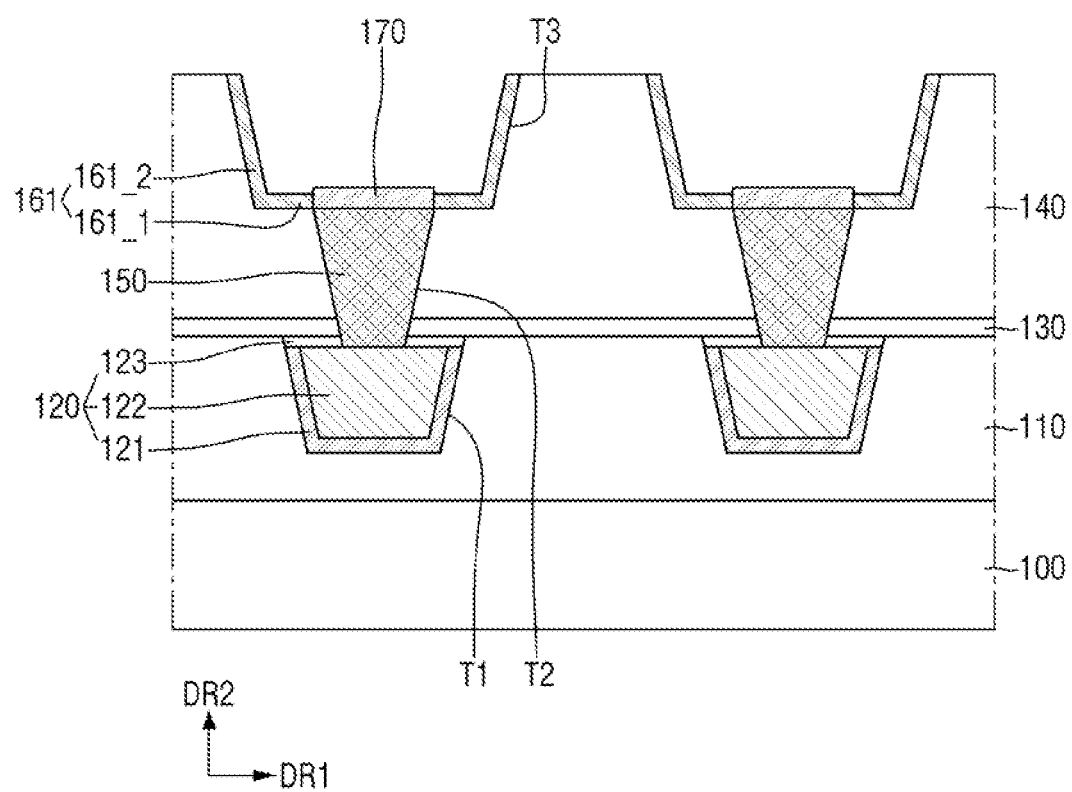

Referring to FIG. 7, in an embodiment, the upper wiring barrier layer 161 is formed on the bottom surface and the side walls of the upper wiring trench T3. A first portion 161_1 of the upper wiring barrier layer 161 is formed on the bottom surface of the upper wiring trench T3. The first portion 161_1 of the upper wiring barrier layer 161 is formed on the side wall of the protective layer 170. A second portion 161_2 of the upper wiring barrier layer 161 is formed on the side walls of the upper wiring trench T3. The upper wiring barrier layer 161 is not formed on the upper surface of the protective layer 170. The upper wiring barrier layer 161 is conformally formed on the bottom surface and the side walls of the upper wiring trench T3.

Although FIG. 7 shows that a thickness of the protective layer 170 in the vertical direction DR2 is greater than the thickness of the first portion 161_1 of the upper wiring barrier layer 161 in the vertical direction DR2, embodiments of the present disclosure are not limited thereto.

Figure 8:
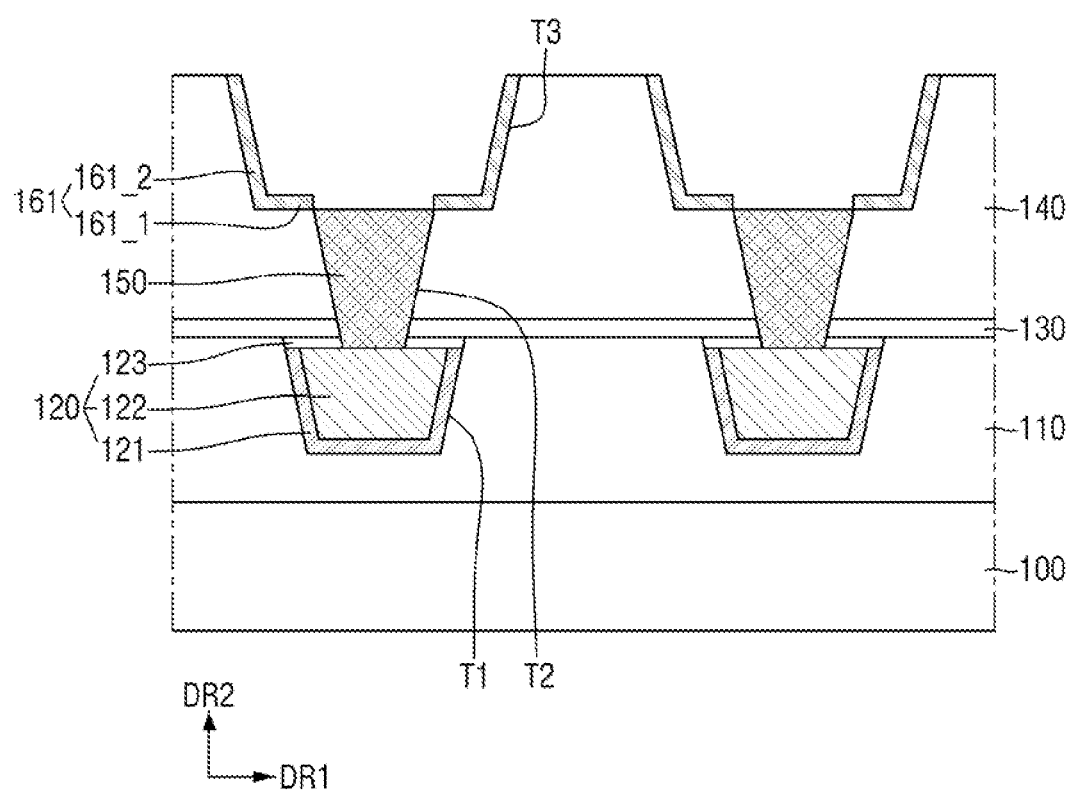

Referring to FIG. 8, in an embodiment, the protective layer 170 is removed. For example, the protective layer 170 is removed through a hydrogen plasma treatment process. By removing the protective layer 170, the upper surface of the via 150 is exposed between the first portions 161_1 of the upper wiring barrier layer 161.

Referring to FIG. 1, in an embodiment, an upper wiring filling layer 162 is formed inside the upper wiring trench T3 on the upper surface of the via 150 and the upper wiring barrier layer 161. The upper wiring filling layer 162 fills the interior of the upper wiring trench T3.

Subsequently, a part of the upper part of the upper wiring barrier layer 161 and a part of the upper part of the upper wiring filling layer 162 are etched inside the upper wiring trench T3. Subsequently, the upper wiring capping pattern 163 is formed in a portion in which the upper wiring barrier layer 161 and the upper wiring filling layer 162 are etched. The semiconductor device shown in FIG. 1 can be fabricated through such a fabricating process.

In a semiconductor device and a method for fabricating the semiconductor device according to some embodiments of the present disclosure, by forming the protective layer 170 on the upper surface of the via 150 in a process of forming the upper wiring pattern 160, the upper wiring barrier layer 161 is not formed on the upper surface of the via 150. Accordingly, the contact resistance between the upper wiring pattern 160 and the via 150 is reduced, which increases reliability of the semiconductor device.

Hereinafter, a method for fabricating a semiconductor device according to some embodiments of the present disclosure will be described with reference to FIGS. 9 to 13. Differences from a method for fabricating a semiconductor device shown in FIGS. 3 to 8 will be mainly described.

FIGS. 9 to 13 are intermediate stage diagrams that illustrate a method for fabricating a semiconductor device according to some embodiments of the present disclosure.

Figure 9:
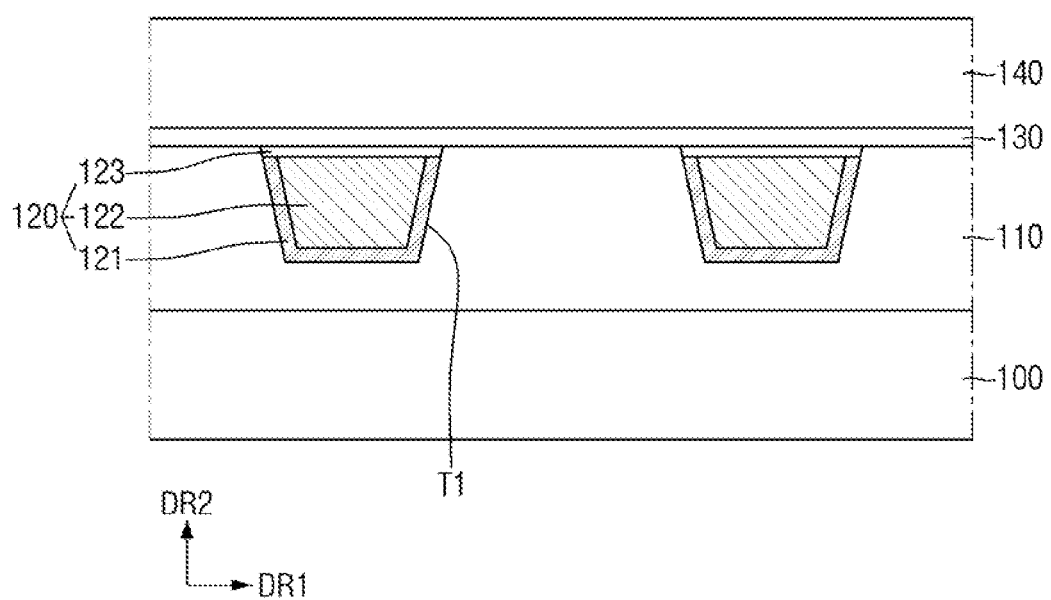
FIGS. 9 to 13 are intermediate stage diagrams that illustrate a method for fabricating a semiconductor device according to some embodiments of the present disclosure.

Referring to FIG. 9, in an embodiment, the first interlayer insulating layer 110 is formed on the substrate 100. Subsequently, the lower wiring trench T1 is formed inside the first interlayer insulating layer 110. Subsequently, the lower wiring pattern 120 is formed inside the lower wiring trench T1.

The lower wiring pattern 120 includes the lower wiring barrier layer 121, the lower wiring filling layer 122, and the lower wiring capping pattern 123 that are sequentially formed inside the lower wiring trench T1. Subsequently, the etch stop layer 130 and the second interlayer insulating layer 140 are sequentially formed on the first interlayer insulating layer 110 and the lower wiring pattern 120. A thickness of the second interlayer insulating layer 140 shown in FIG. 9 in the vertical direction DR2 is less than a thickness of the second interlayer insulating layer 140 shown in FIG. 3 in the vertical direction DR2.

Figure 10:
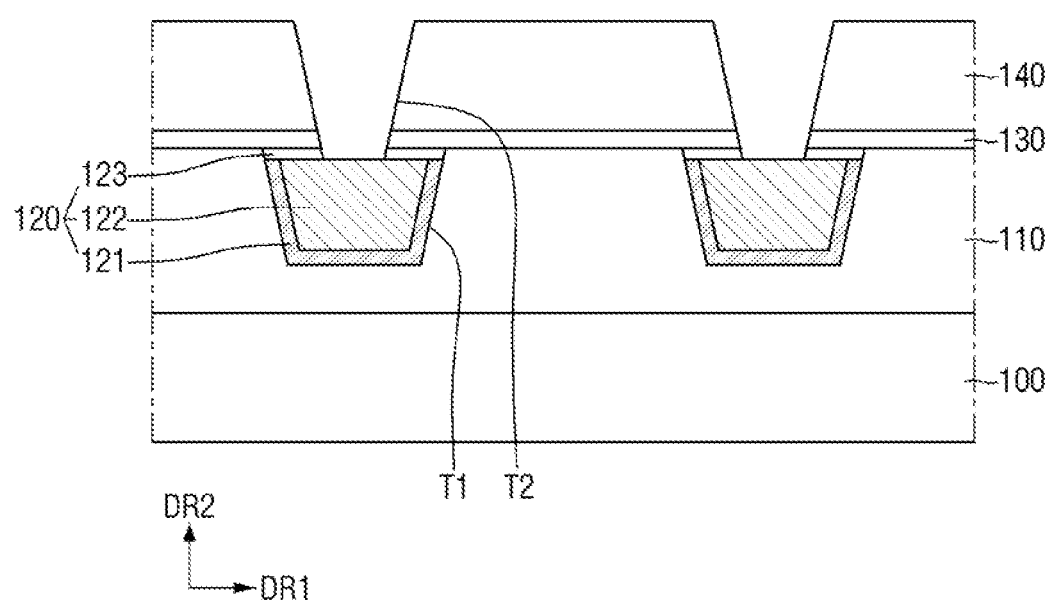

Referring to FIG. 10, in an embodiment, the via trench T2 is formed inside the second interlayer insulating layer 140. Specifically, the via trench T2 extends from the upper surface of the second interlayer insulating layer 140 toward the lower wiring pattern 120. The via trench T2 penetrates the etch stop layer 130 in the vertical direction DR2 and exposes the lower wiring pattern 120. For example, the via trench T2 penetrates the lower wiring capping pattern 123 in the vertical direction DR2 and exposes the lower wiring filling layer 122.

Figure 11:
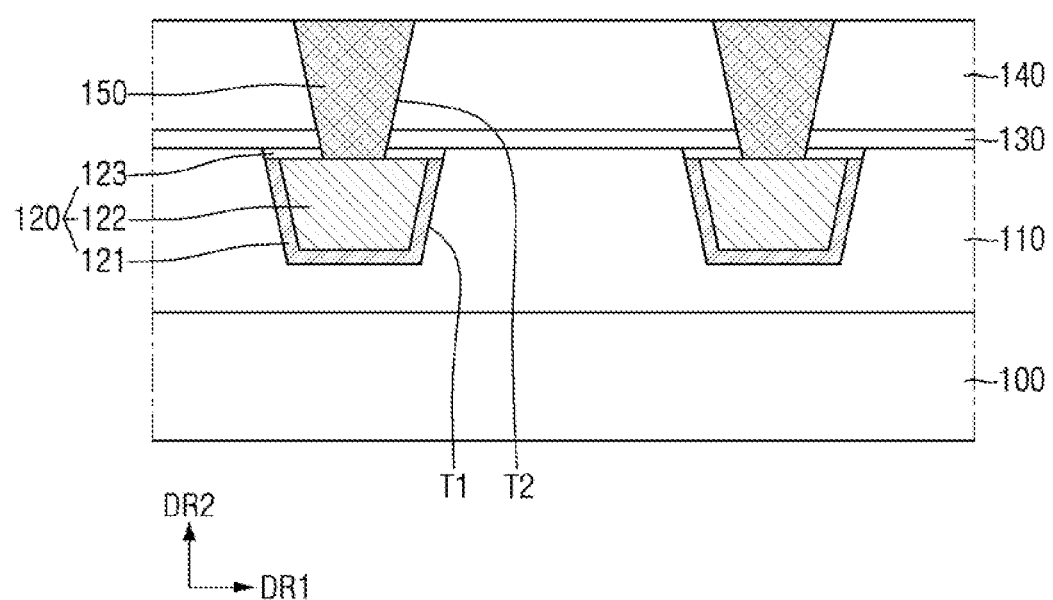

Referring to FIG. 11, in an embodiment, the via 150 is formed inside the via trench T2. In an embodiment, the via 150 completely fills the via trench T2. The via 150 is formed of a single film.

Figure 12:
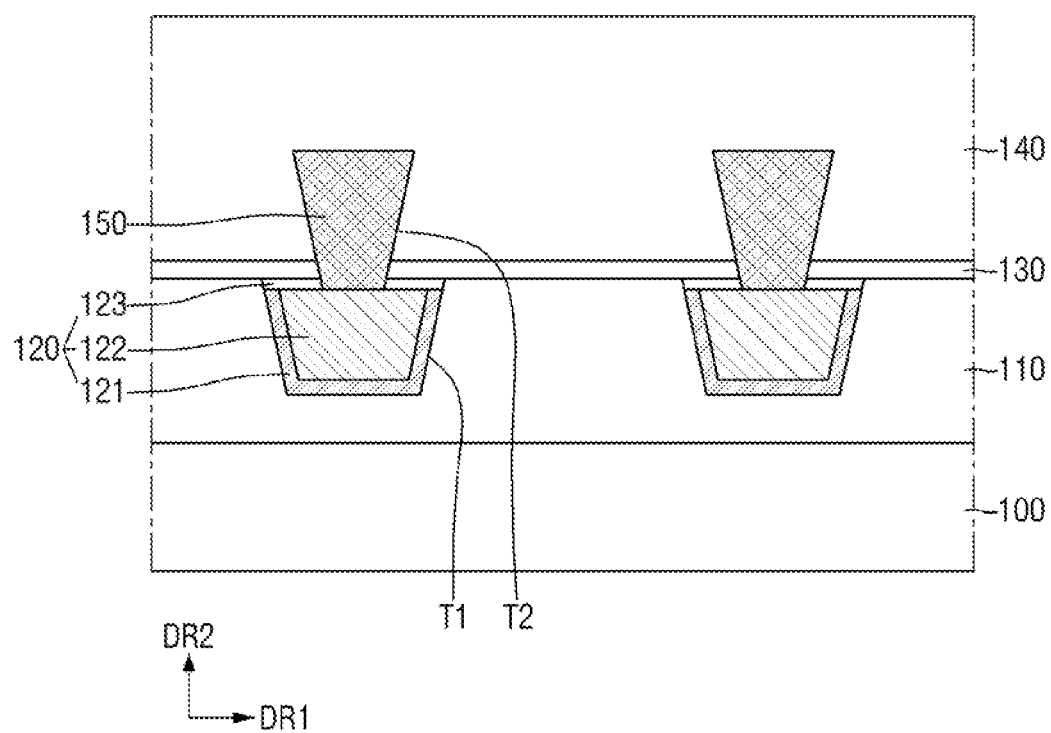

Referring to FIG. 12, in an embodiment, a second interlayer insulating layer 140 is additionally formed on the via 150 and the second interlayer insulating layer 140 shown in FIG. 11.

Figure 13:
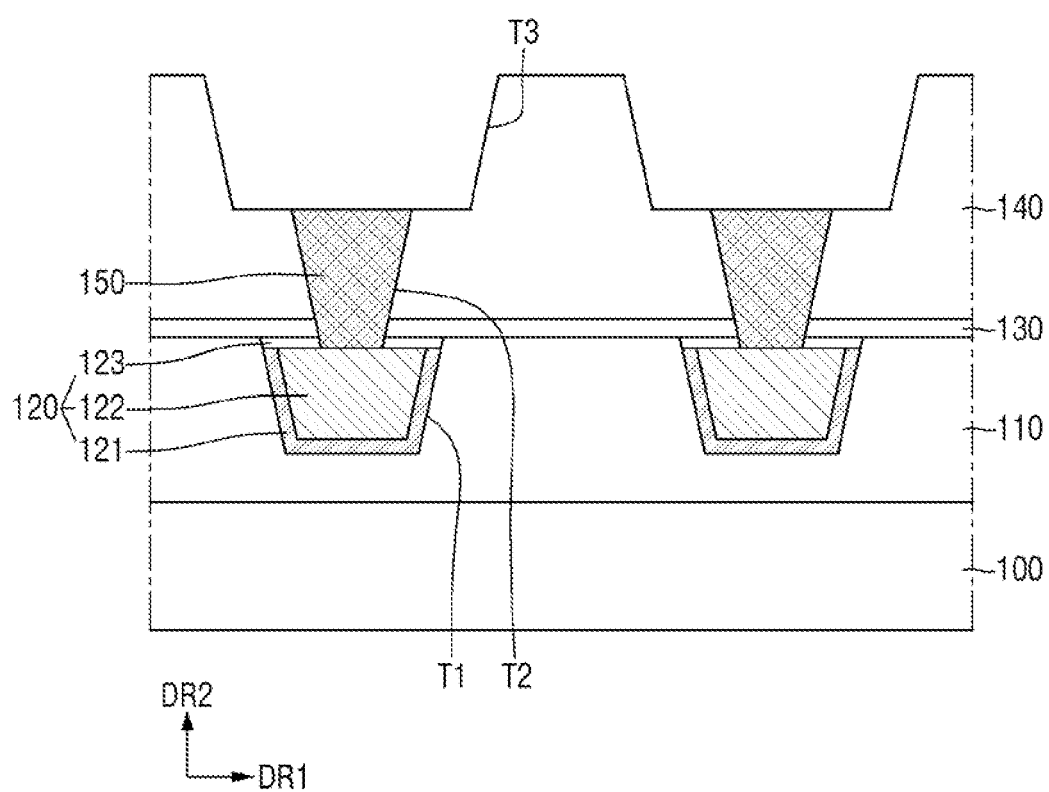

Referring to FIG. 13, in an embodiment, the upper wiring trench T3 is formed inside the second interlayer insulating layer 140. Specifically, the upper wiring trench T3 extends from the upper surface of the second interlayer insulating layer 140 toward the lower wiring pattern 120. A lower surface of the upper wiring trench T3 is formed inside the second interlayer insulating layer 140. The upper wiring trench T3 exposes the upper surface of the via 150. A width of the upper wiring trench T3 in the horizontal direction DR1 is greater than a width of the via trench T2 in the horizontal direction DR1. The upper wiring trench T3 overlaps and surrounds the via trench T2.

Subsequently, after performing the fabricating processes shown in FIGS. 6 to 8, the upper wiring filling layer 162 and the upper wiring capping pattern 163 are sequentially formed on the upper surface of the via 150 and the upper wiring barrier layer 161 inside the upper wiring trench T3. The semiconductor device shown in FIG. 1 can be fabricated through such fabricating processes.

Hereinafter, a semiconductor device according to some embodiments of the present disclosure will be described referring to FIG. 14. Differences from semiconductor devices shown in FIGS. 1 and 2 will be mainly described.

Figure 14:
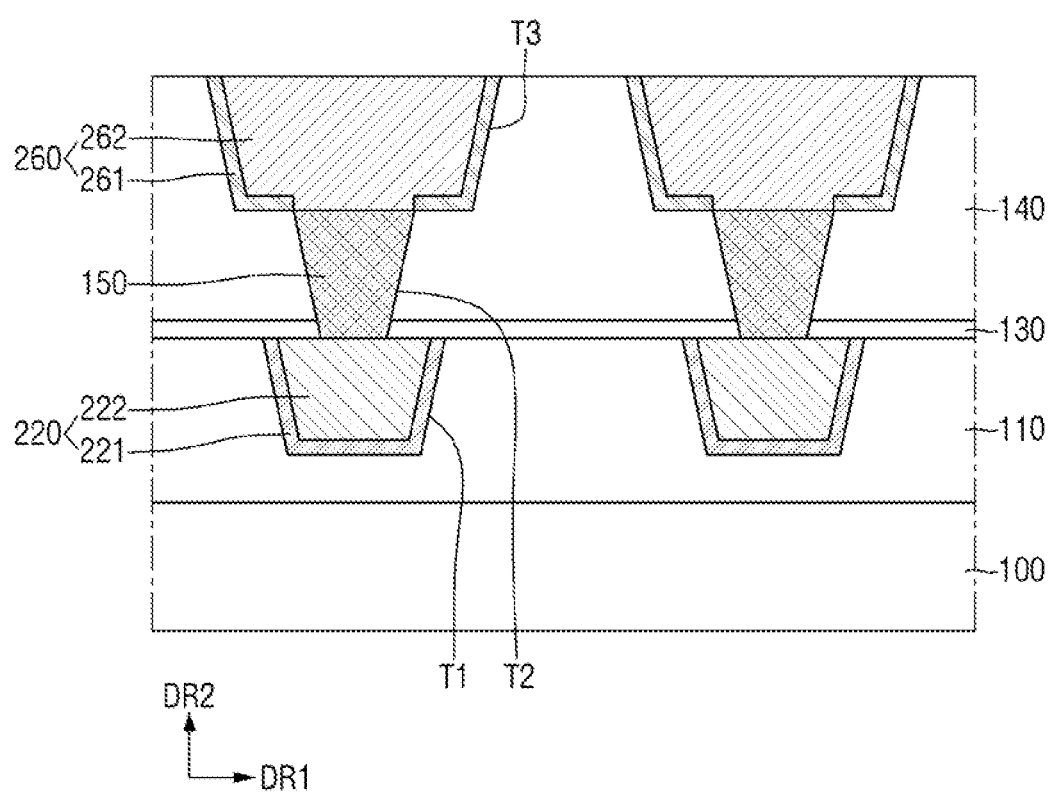
FIG. 14 illustrates a semiconductor device according to some embodiments of the present disclosure.

FIG. 14 illustrates a semiconductor device according to some embodiments of the present disclosure.

Referring to FIG. 14, in a semiconductor device according to some embodiments of the present disclosure, a lower wiring pattern 220 includes a lower wiring barrier layer 221, and a lower wiring filling layer 222 that fills the lower wiring trench T1 on the lower wiring barrier layer 221. In an embodiment, the lower wiring filling layer 222 completely fills the lower wiring trench T1. Further, the upper wiring pattern 260 includes an upper wiring barrier layer 261, and an upper wiring filling layer 262 that fills the upper wiring trench T3 on the upper wiring barrier layer 261. In an embodiment, the upper wiring filling layer 262 completely fills the upper wiring trench T3.

Each of a top surface of the lower wiring barrier layer 221 and an upper surface of the lower wiring filling layer 222 are in contact with the etch stop layer 130. Each of the top surface of the upper wiring barrier layer 261 and the upper surface of the upper wiring filling layer 262 are coplanar with the upper surface of the second interlayer insulating layer 140.

Hereinafter, a semiconductor device according to some embodiments of the present disclosure will be described with reference to FIGS. 15 and 16. Differences from semiconductor devices shown in FIGS. 1 and 2 will be mainly described.

Figure 15:
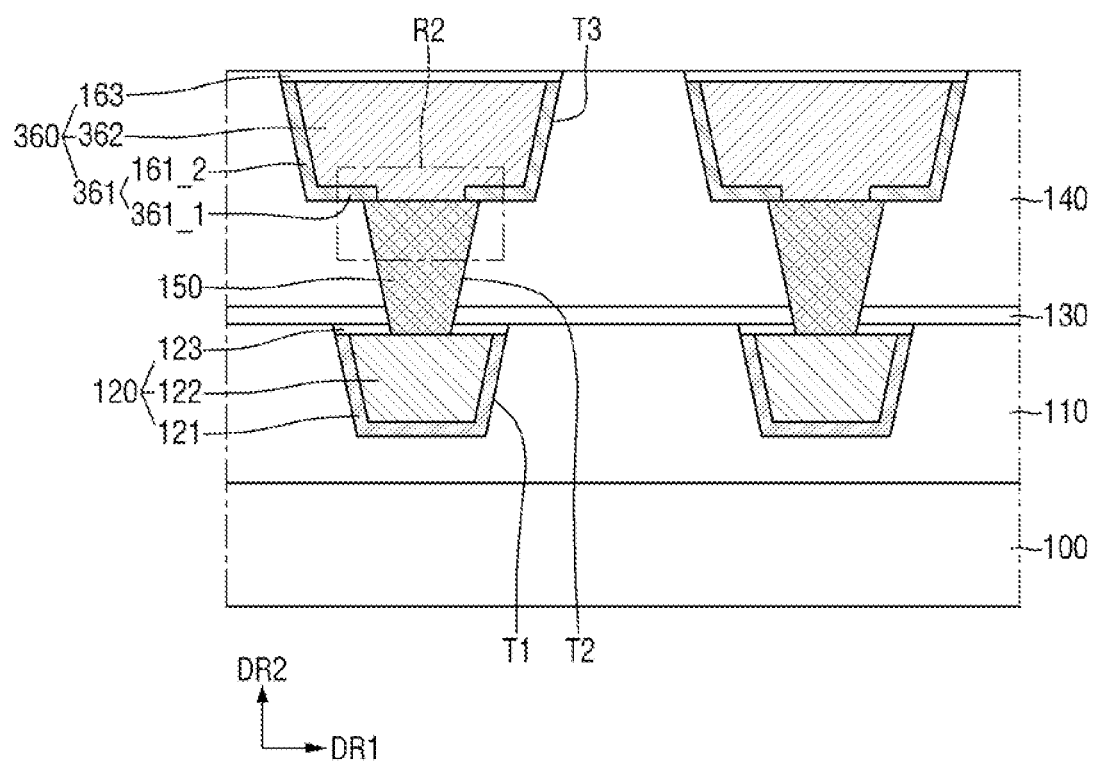
FIG. 15 illustrates a semiconductor device according to some embodiments of the present disclosure.

FIG. 15 illustrates a semiconductor device according to some embodiments of the present disclosure. FIG. 16 is an enlarged view of a region R2 of FIG. 15.

Figure 16:
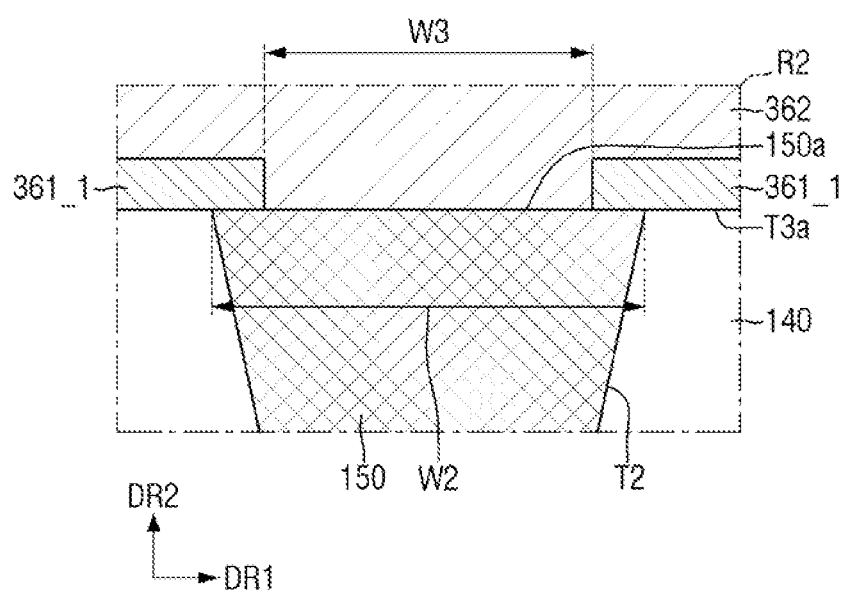
FIG. 16 is an enlarged view of a region R2 of FIG. 15.

Referring to FIGS. 15 and 16, in a semiconductor device according to some embodiments of the present disclosure, an upper wiring pattern 360 includes an upper wiring barrier layer 361, an upper wiring filling layer 362, and an upper wiring capping pattern 163. The upper wiring barrier layer 361 includes a first portion 361_1 and a second portion 161_2.

The first portion 361_1 of the upper wiring barrier layer 361 is disposed on the bottom surface of the upper wiring trench T3. The first portion 361_1 of the upper wiring barrier layer 361 is disposed on either side of the via 150. At least a part of the first portion 361_1 of the upper wiring barrier layer 361 is disposed on the upper surface 105a of the via 150. The upper surface 150a of the via 150 is exposed between the first portions 361_1 of the upper wiring barrier layer 361. The second portion 161_2 of the upper wiring barrier layer 361 is disposed on the side wall of the upper wiring trench T3.

The upper wiring filling layer 362 is disposed inside the upper wiring trench T3 on the upper wiring barrier layer 361 and the upper surface 150a of the via 150. A part of the upper wiring filling layer 362 is disposed between the first portions 361_1 of the upper wiring barrier layer 361. The upper wiring filling layer 362 is in contact with the upper surface 150a of the via 150 between the first portions 361_1 of the upper wiring barrier layer 361. The width W3 in the horizontal direction DR1 of the upper wiring filling layer 362 between the first portions 361_1 of the upper wiring barrier layer 361 is less than the width W2 in the horizontal direction DR1 of the upper surface 150a of the via 150.

Hereinafter, a semiconductor device according to some embodiments of the present disclosure will be described referring to FIGS. 17 and 18. Differences from semiconductor devices shown in FIGS. 1 and 2 will be mainly described.

Figure 17:
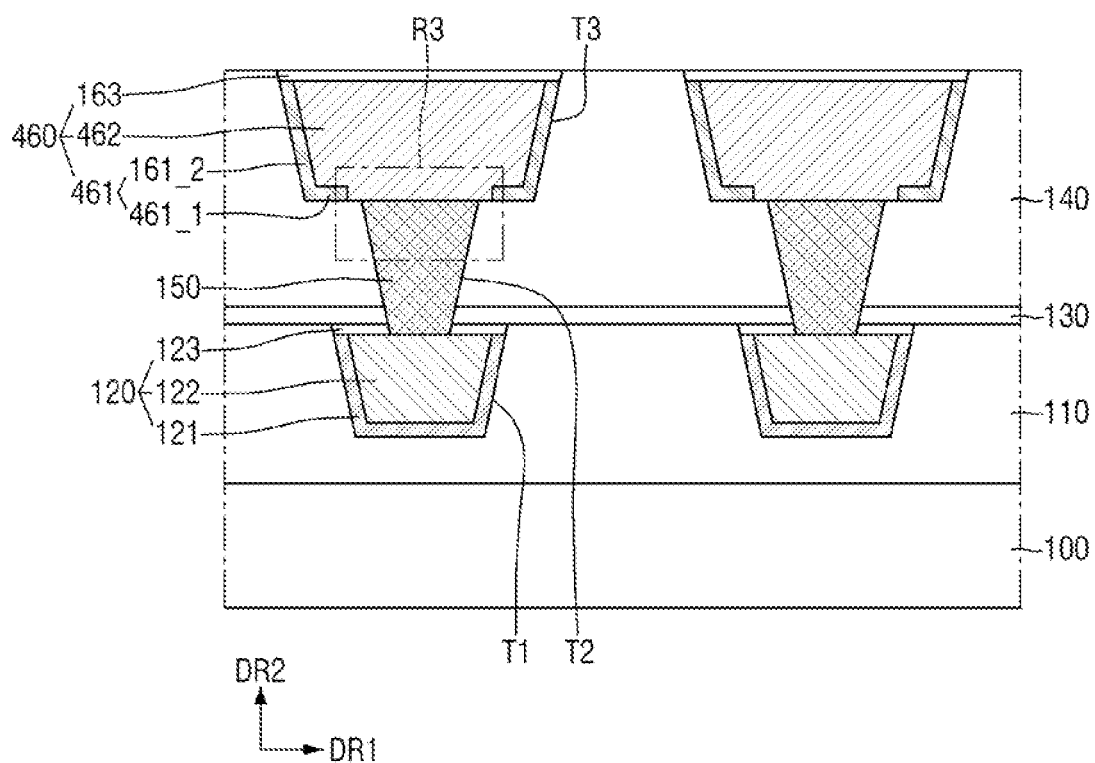
FIG. 17 illustrates a semiconductor device according to some embodiments of the present disclosure.

FIG. 17 illustrates a semiconductor device according to some embodiments of the present disclosure. FIG. 18 is an enlarged view of a region R3 of FIG. 17.

Figure 18:
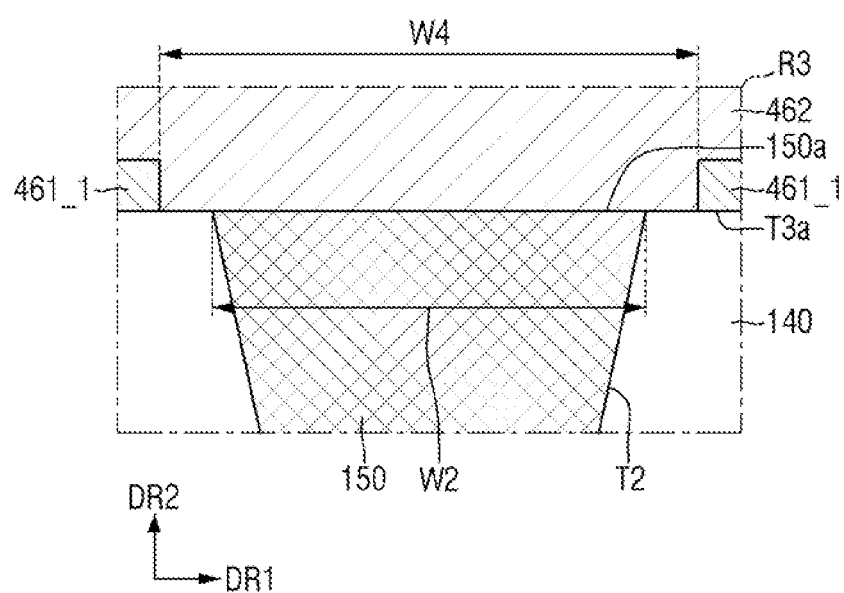
FIG. 18 is an enlarged view of a region R3 of FIG. 17.

Referring to FIGS. 17 and 18, in a semiconductor device according to some embodiments of the present disclosure, an upper wiring pattern 460 includes an upper wiring barrier layer 461, an upper wiring filling layer 462, and an upper wiring capping pattern 163. The upper wiring barrier layer 461 includes a first portion 461_1 and a second portion 161_2.

The first portion 461_1 of the upper wiring barrier layer 461 is disposed on the bottom surface of the upper wiring trench T3. The first portion 461_1 of the upper wiring barrier layer 461 is disposed on either side of the via 150. The upper surface 150a of the via 150 is exposed between the first portions 461_1 of the upper wiring barrier layer 461. Further, the second interlayer insulating layer 140 is exposed between the first portions 461_1 of the upper wiring barrier layer 461. That is, the first portion 461_1 of the upper wiring barrier layer 461 does not extend all the way to the upper surface 150a of the via 150, and the second interlayer insulating layer 140 is exposed between the first portions 461_1 of the upper wiring barrier layer 461 and the upper surface 150a of the via 150. The second portion 161_2 of the upper wiring barrier layer 461 is disposed on the side wall of the upper wiring trench T3.

The upper wiring filling layer 462 is disposed inside the upper wiring trench T3 on the upper wiring barrier layer 461, the upper surface 150a of the via 150, and the second interlayer insulating layer 140. A part of the upper wiring filling layer 462 is disposed between the first portions 461_1 of the upper wiring barrier layer 461. The upper wiring filling layer 462 is in contact with each of the upper surface 150a of the via 150 and the second interlayer insulating layer 140 between the first portions 461_1 of the upper wiring barrier layer 461. A width W4 in the horizontal direction DR1 of the upper wiring filling layer 462 disposed between the first portions 461_1 of the upper wiring barrier layer 461 is greater than the width W2 in the horizontal direction DR1 of the upper surface 150a of the via 150.

Hereinafter, a semiconductor device according to some embodiments of the present disclosure will be described with reference to FIGS. 19 and 20. Differences from semiconductor devices shown in FIGS. 1 and 2 will be mainly described.

Figure 19:
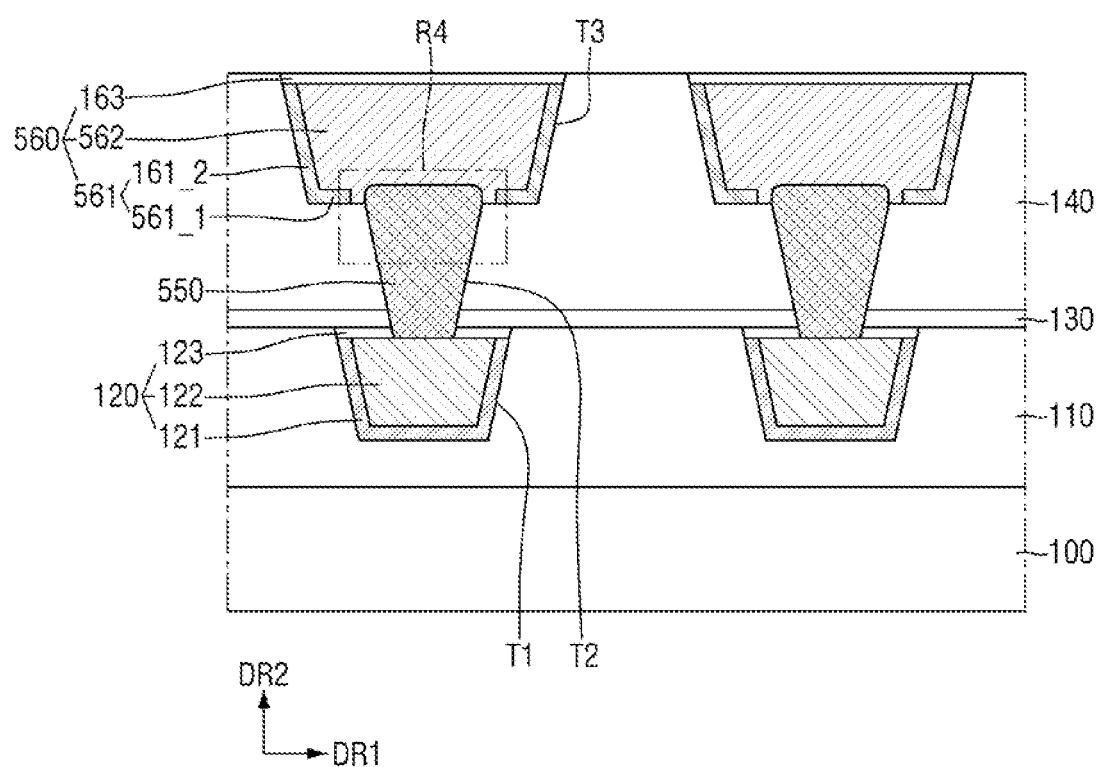
FIG. 19 illustrates a semiconductor device according to some embodiments of the present disclosure.

FIG. 19 illustrates a semiconductor device according to some embodiments of the present disclosure. FIG. 20 is an enlarged view of a region R4 of FIG. 19.

Figure 20:
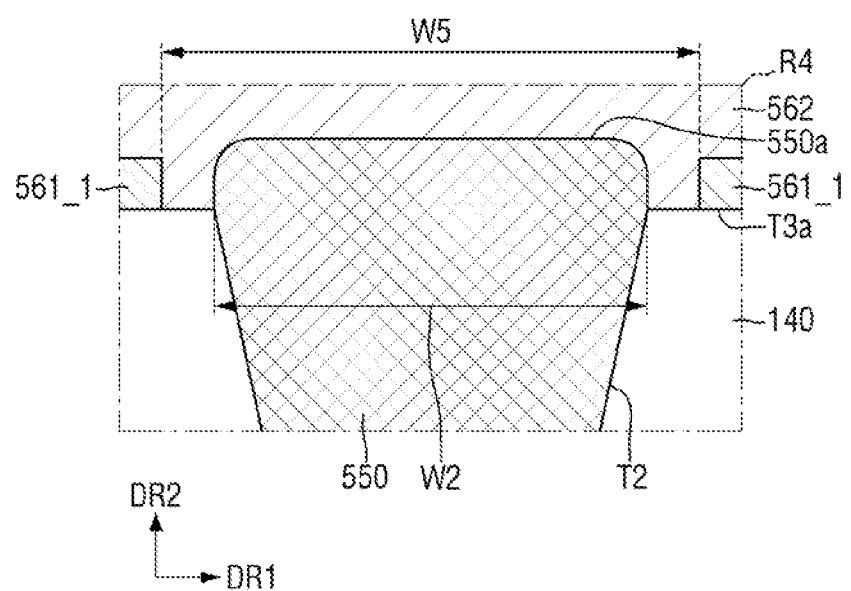
FIG. 20 is an enlarged view of a region R4 of FIG. 19.

Referring to FIGS. 19 and 20, in a semiconductor device according to some embodiments of the present disclosure, an upper surface 550a of a via 550 is higher than a lower surface T3a of the upper wiring trench T3. That is, the upper surface 550a of the via 550 protrudes above the lower surface T3a of the upper wiring trench T3.

An upper wiring pattern 560 includes an upper wiring barrier layer 561, an upper wiring filling layer 562, and an upper wiring capping pattern 163. The upper wiring barrier layer 561 includes a first portion 561_1 and a second portion 161_2.

The first portion 561_1 of the upper wiring barrier layer 561 is disposed on the bottom surface of the upper wiring trench T3. The first portion 561_1 of the upper wiring barrier layer 561 is disposed on either side of the via 150. The upper surface 550a and a part of the side wall of the via 550 are exposed between the first portions 561_1 of the upper wiring barrier layer 561. Further, the second interlayer insulating layer 140 is exposed between the first portions 561_1 of the upper wiring barrier layer 561. That is, the first portion 561_1 of the upper wiring barrier layer 561 does not extend all the way to the via 150, and the second interlayer insulating layer 140 is exposed between the first portions 561_1 of the upper wiring barrier layer 561 and the via 550. The second portion 161_2 of the upper wiring barrier layer 561 is disposed on the side wall of the upper wiring trench T3.

The upper wiring filling layer 562 is disposed inside the upper wiring trench T3 on the upper wiring barrier layer 561, the upper surface 550a of the via 550, a part of the side wall of the via 550, and the second interlayer insulating layer 140. A part of the upper wiring filling layer 562 is disposed between the first portions 561_1 of the upper wiring barrier layer 561. Further, a part of the upper wiring filling layer 562 is disposed between the first portion 561_1 of the upper wiring barrier layer 561 and the via 550.

The upper wiring filling layer 562 is in contact with each of the upper surface 550a of the via 550, a part of the side wall of the via 550, and the second interlayer insulating layer 140 between the first portions 561_1 of the upper wiring barrier layer 561. Further, the upper wiring filling layer 562 is in contact with the second interlayer insulating layer 140 between the first portion 561_1 of the upper wiring barrier layer 561 and the via 550. A width W5 in the horizontal direction DR1 between the first portions 561_1 of the upper wiring barrier layer 561 is greater than the width W2 in the horizontal direction DR1 of the portion of the via 550 at the same plane as the lower surface T3a of the upper wiring trench T3.

Hereinafter, a semiconductor device according to some embodiments of the present disclosure will be described with reference to FIGS. 21 and 22. Differences from semiconductor devices shown in FIGS. 1 and 2 will be mainly described.

Figure 21:
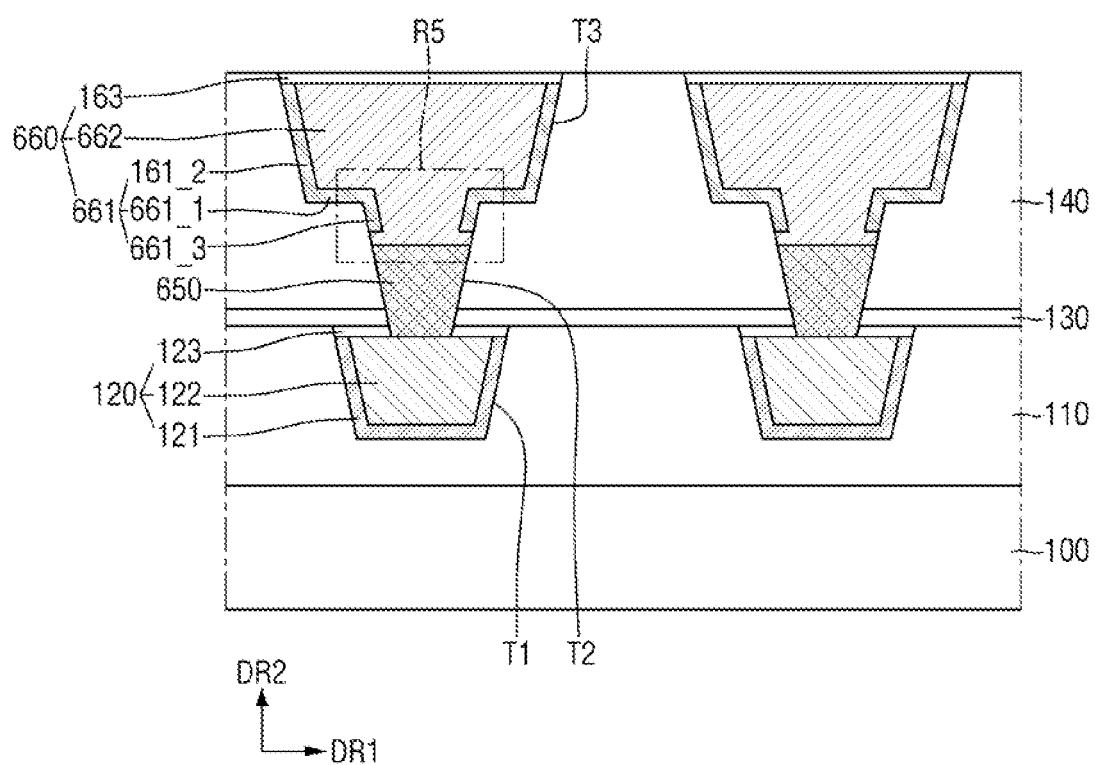
FIG. 21 illustrates a semiconductor device according to some embodiments of the present disclosure.

FIG. 21 illustrates a semiconductor device according to some embodiments of the present disclosure. FIG. 22 is an enlarged view of a region R5 of FIG. 21.

Figure 22:
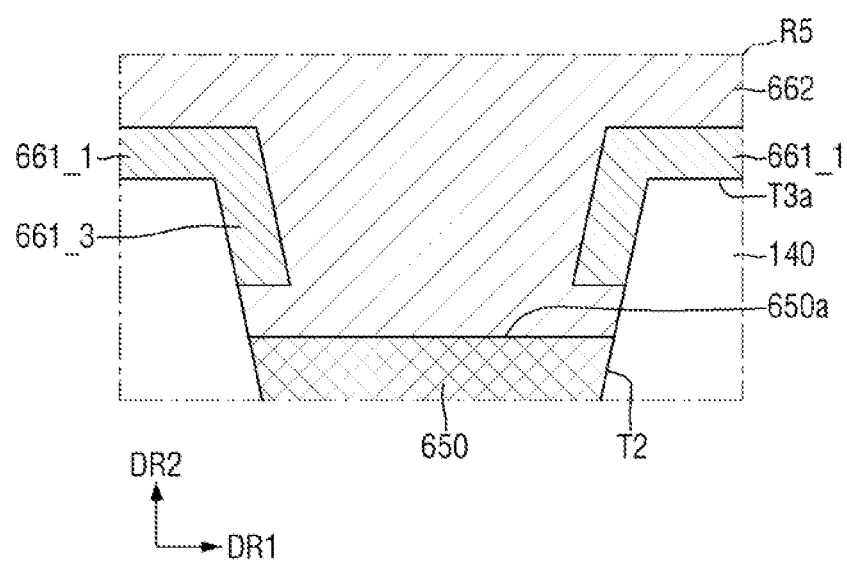
FIG. 22 is an enlarged view of a region R5 of FIG. 21.

Referring to FIGS. 21 and 22, in a semiconductor device according to some embodiments of the present disclosure, an upper surface 650a of a via 650 is lower than a lower surface T3a of the upper wiring trench T3. The via 650 is disposed in a part of the interior of the via trench T2. An upper wiring pattern 660 is disposed in a remaining part of the interior of the via trench T2. That is, a portion of the upper wiring pattern 660 protrudes into the via trench T2 and makes contact with the upper surface 650a of a via 650.

The upper wiring pattern 660 includes an upper wiring barrier layer 661, an upper wiring filling layer 662, and an upper wiring capping pattern 163. The upper wiring barrier layer 661 includes a first portion 661_1, a second portion 161_2 and a third portion 661_3.

The first portion 661_1 of the upper wiring barrier layer 661 is disposed on the bottom surface of the upper wiring trench T3. The first portion 661_1 of the upper wiring barrier layer 661 is disposed on either side of the via 650. The second portion 161_2 of the upper wiring barrier layer 661 is disposed on the side wall of the upper wiring trench T3.

The third portion 661_3 of the upper wiring barrier layer 661 is disposed on upper portions of the side wall of the via trench T2 above the upper surface 650a of the via 650. The third portion 661_3 of the upper wiring barrier layer 661 are spaced apart from the upper surface 650a of the via 650 in the vertical direction DR2.

The upper wiring filling layer 662 is disposed inside the upper wiring trench T3 on the upper wiring barrier layer 661. The upper wiring filling layer 662 is disposed inside the via trench T2 on the upper surface 650a of the via 650 and the upper wiring barrier layer 661.

The upper wiring filling layer 662 is disposed between the third portion 661_3 of the upper wiring barrier layer 661 and the upper surface 650a of the via 650. The upper wiring filling layer 662 disposed between the third portion 661_3 of the upper wiring barrier layer 661 and the upper surface 650a of the via 650 is in contact with each of the second interlayer insulating layer 140 and the upper surface 650a of the via 650.

Hereinafter, a semiconductor device according to some embodiments of the present disclosure will be described with reference to FIG. 23. Differences from semiconductor devices shown in FIGS. 1 and 2 will be mainly described.

Figure 23:
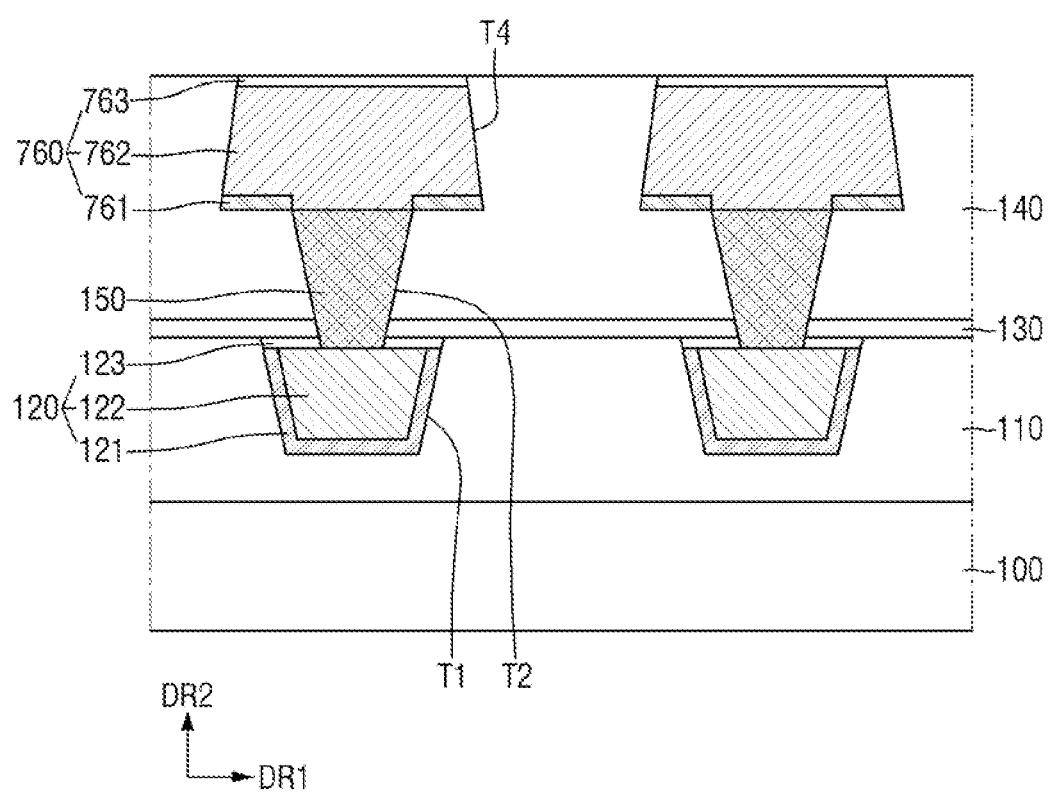
FIG. 23 illustrates a semiconductor device according to some embodiments of the present disclosure.

FIG. 23 illustrates a semiconductor device according to some embodiments of the present disclosure.

Referring to FIG. 23, in a semiconductor device according to some embodiments of the present disclosure, an upper wiring pattern 760 includes an upper wiring barrier layer 761, an upper wiring filling layer 762, and an upper wiring capping pattern 763.

A width of the upper wiring trench T4 in the horizontal direction DR1 decreases toward the upper surface of the second interlayer insulating layer 140. The upper wiring barrier layer 761 is disposed on the bottom surface of the upper wiring trench T4. The upper wiring barrier layer 761 is disposed on either side of the via 150. The upper surface 150a of the via 150 is exposed between the upper wiring barrier layers 761. The upper wiring barrier layer 761 is not disposed on the side wall of the upper wiring trench T4.

The upper wiring filling layer 762 is disposed inside the upper wiring trench T4 on the upper wiring barrier layer 761 and the upper surface 150a of the via 150. A part of the upper wiring filling layer 762 is disposed between the upper wiring barrier layers 761. The upper wiring filling layer 762 is in contact with the upper surface 150a of the via 150 between the upper wiring barrier layers 761. The side wall of the upper wiring filling layer 762 is in contact with the second interlayer insulating layer 140. The upper wiring capping pattern 763 is disposed on the upper surface of the upper wiring filling layer 762.

Hereinafter, a method for fabricating a semiconductor device according to some embodiments of the present disclosure will be described with reference to FIGS. 24 to 28. Differences from a method for fabricating a semiconductor device shown in FIGS. 3 to 8 will be mainly described.

FIGS. 24 to 28 are intermediate stage diagrams that illustrate a method for fabricating a semiconductor device according to some embodiments of the present disclosure.

Figure 24:
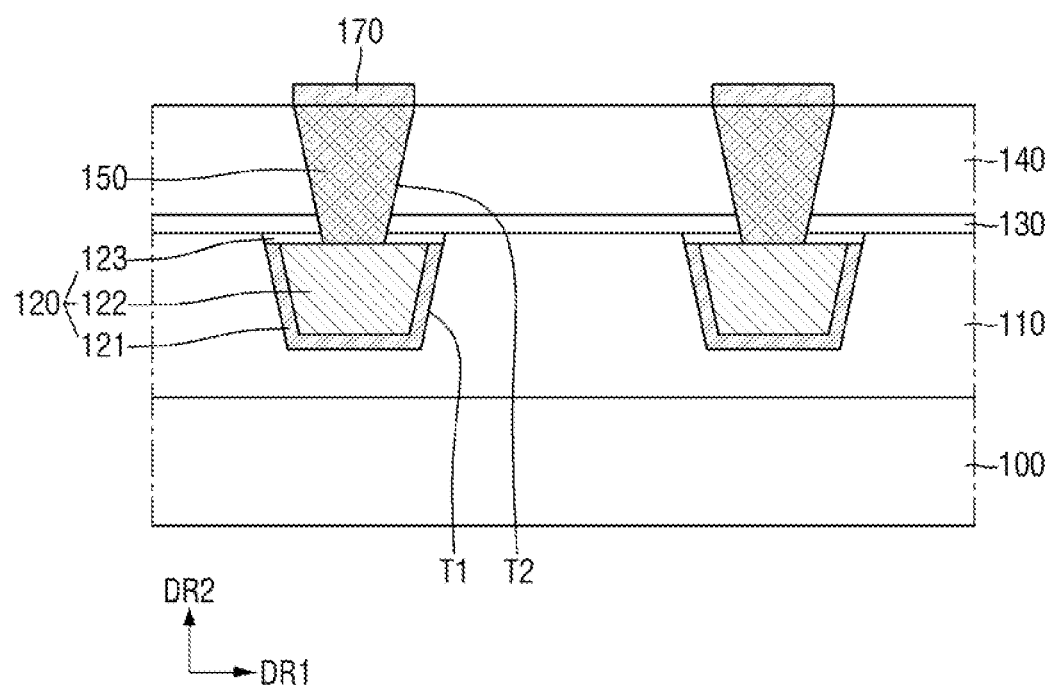
FIGS. 24 to 28 are intermediate stage diagrams that illustrate a method for fabricating a semiconductor device according to some embodiments of the present disclosure.

Referring to FIG. 24, in an embodiment, the first interlayer insulating layer 110 is formed on the substrate 100. Subsequently, the lower wiring trench T1 is formed inside the first interlayer insulating layer 110. Subsequently, the lower wiring pattern 120 is formed inside the lower wiring trench T1.

The lower wiring pattern 120 includes a lower wiring barrier layer 121, a lower wiring filling layer 122, and a lower wiring capping pattern 123 that are sequentially formed inside the lower wiring trench T1. Subsequently, the etch stop layer 130 and the second interlayer insulating layer 140 are sequentially formed on the first interlayer insulating layer 110 and the lower wiring pattern 120. The thickness in the vertical direction DR2 of the second interlayer insulating layer 140 shown in FIG. 24 is less than the thickness in the vertical direction DR2 of the second interlayer insulating layer 140 shown in FIG. 3.

Subsequently, the via trench T2 is formed inside the second interlayer insulating layer 140. Specifically, the via trench T2 extends from the upper surface of the second interlayer insulating layer 140 toward the lower wiring pattern 120. The via trench T2 penetrates the etch stop layer 130 in the vertical direction DR2 and exposes the lower wiring pattern 120. For example, the via trench T2 penetrates the lower wiring capping pattern 123 in the vertical direction DR2 and expose the lower wiring filling layer 122.

Subsequently, the via 150 is formed inside the via trench T2. In an embodiment, the via 150 completely fills the via trench T2. The via 150 is formed of a single film.

Subsequently, the protective layer 170 is formed on the upper surface of the via 150. In an embodiment, the protective layer 170 completely overlaps the upper surface of the via 150 in the vertical direction DR2. The width of the protective layer 170 in the horizontal direction DR1 is the same as the width of the upper surface of the via 150 in the horizontal direction DR1.

Figure 25:
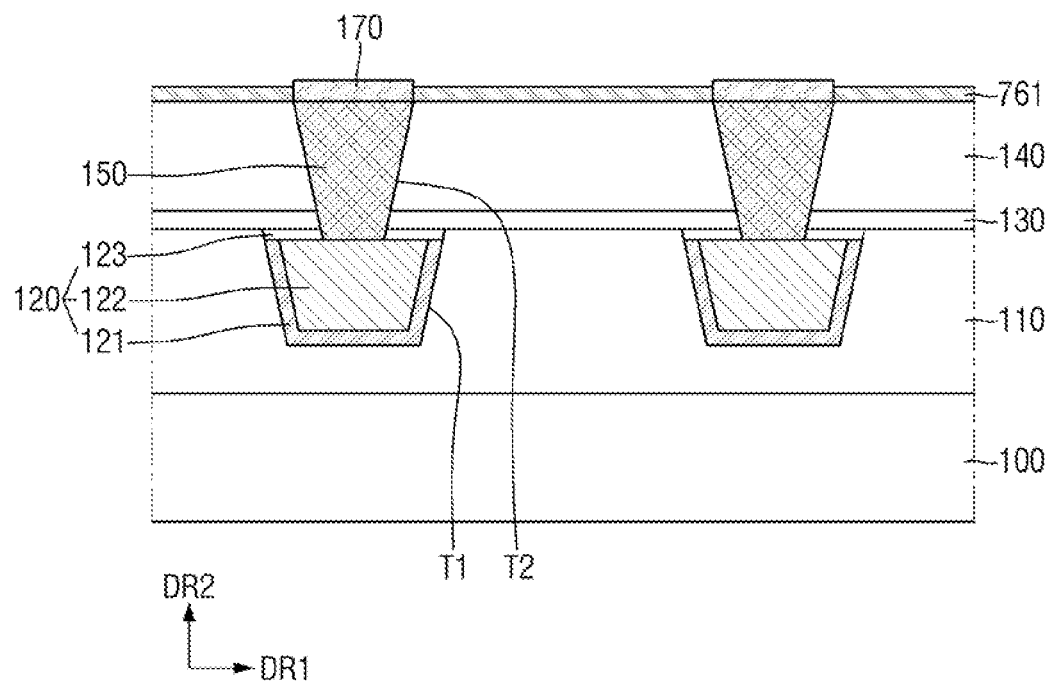

Referring to FIG. 25, in an embodiment, the upper wiring barrier layer 761 is formed on the upper surface of the second interlayer insulating layer 140. The upper wiring barrier layer 761 is formed on the side wall of the protective layer 170. The upper wiring barrier layer 761 is not formed on the upper surface of the protective layer 170. For example, the upper wiring barrier layer 761 is conformally formed.

Figure 26:
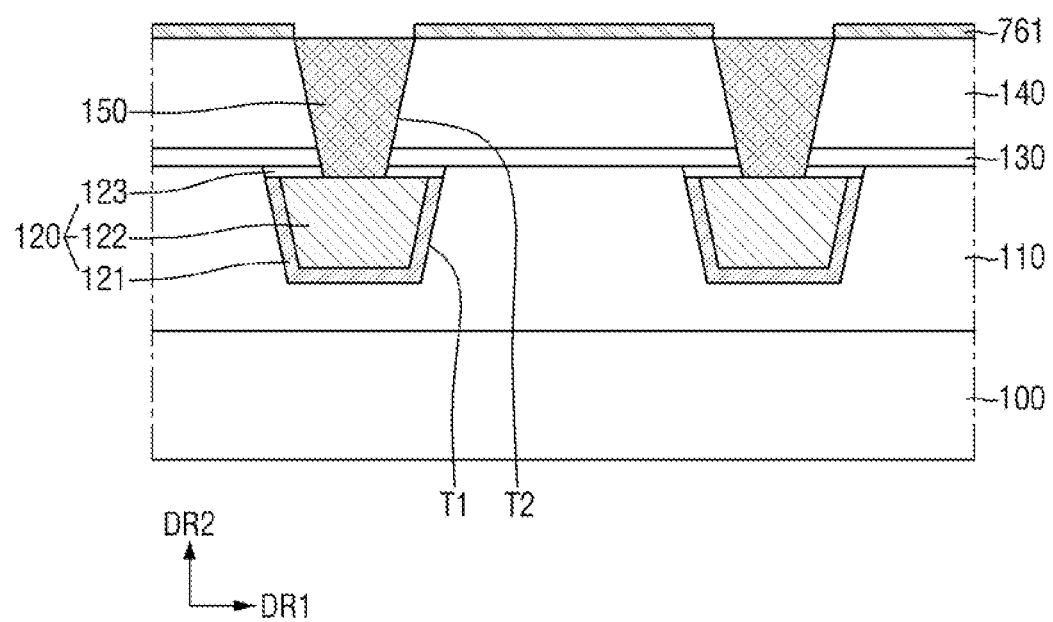

Referring to FIG. 26, in an embodiment, the protective layer 170 is removed. For example, the protective layer 170 is removed through a hydrogen plasma treatment process. By removing the protective layer 170, the upper surface of the via 150 is exposed between the upper wiring barrier layers 761.

Figure 27:
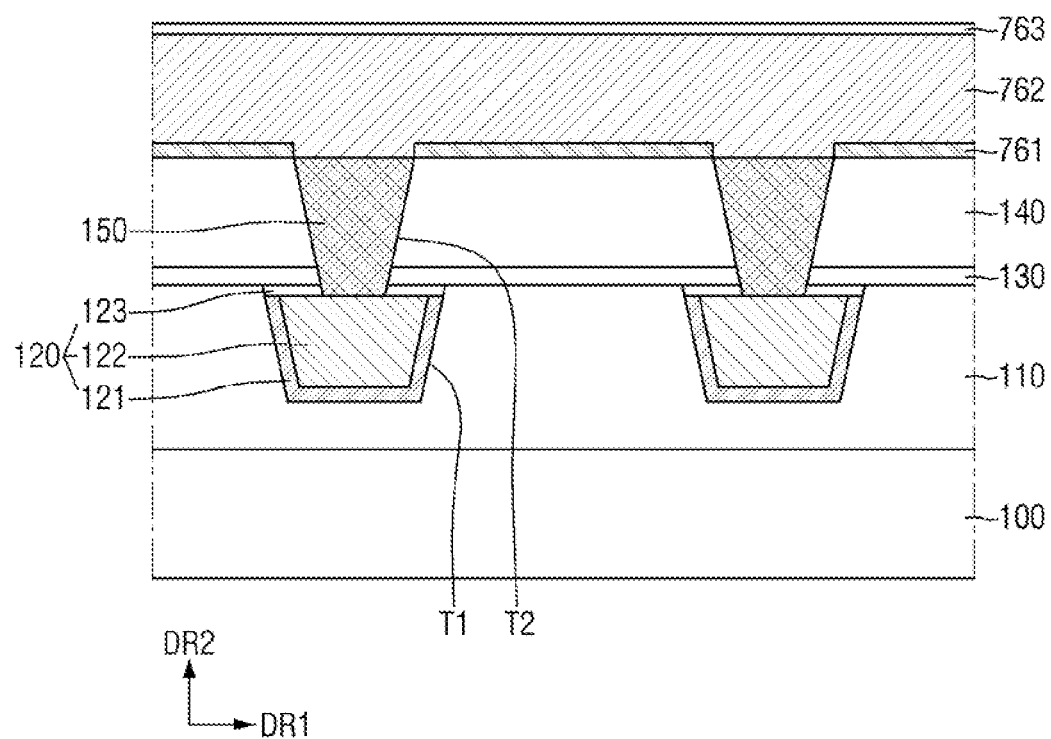

Referring to FIG. 27, in an embodiment, the upper wiring filling layer 762 and the upper wiring capping pattern 763 are sequentially formed on the upper surface of the via 150 and the upper wiring barrier layer 761.

Figure 28:
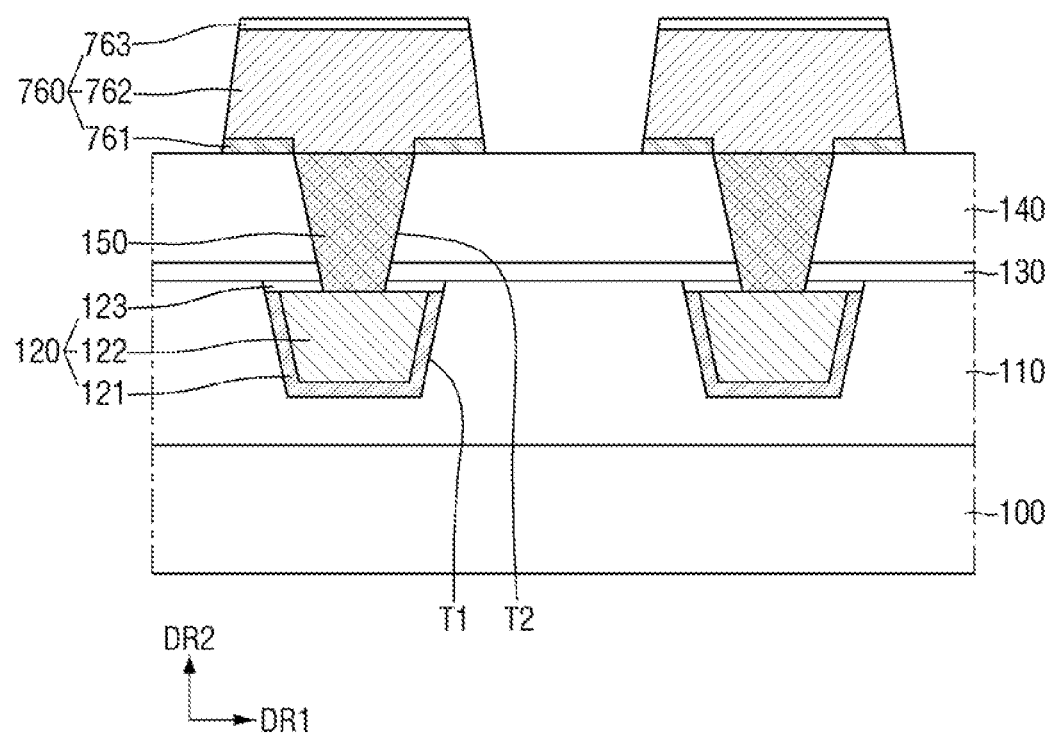

Referring to FIG. 28, in an embodiment, the upper wiring barrier layer 761, the upper wiring filling layer 762 and the upper wiring capping pattern 763 are patterned to form the upper wiring pattern 760. Specifically, after forming a mask pattern on the upper wiring capping pattern 763, by etching the upper wiring barrier layer 761, the upper wiring filling layer 762 and the upper wiring capping pattern 763 using the mask pattern as a mask, the upper wiring pattern 760 is formed.

Referring to FIG. 23, the second interlayer insulating layer 140 is additionally formed that surrounds the side wall of the upper wiring pattern 760. The upper wiring filling layer 762 is in contact with the second interlayer insulating layer 140. Through such fabricating processes, the semiconductor device shown in FIG. 23 can be fabricated.

In concluding the detailed description, those skilled in the art will appreciate that many variations and modifications may be made to embodiments without substantially departing from the principles of the present disclosure. Therefore, disclosed embodiments of the disclosure are used in a generic and descriptive sense only and not for purposes of limitation.

What is claimed is:

1. A semiconductor device, comprising:
a substrate;
a first interlayer insulating layer disposed on the substrate;
a lower wiring pattern disposed inside the first interlayer insulating layer;
an etch stop layer disposed on the first interlayer insulating layer;
a second interlayer insulating layer disposed on the etch stop layer;
a via trench formed inside the second interlayer insulating layer and the etch stop layer, wherein the via trench extends to the lower wiring pattern;
a via disposed inside the via trench, in contact with the second interlayer insulating layer, and formed of a single film;
an upper wiring trench formed inside the second interlayer insulating layer and on the via; and
an upper wiring pattern disposed inside the upper wiring trench, wherein the upper wiring pattern includes an upper wiring barrier layer and an upper wiring filling layer disposed on the upper wiring barrier layer,
wherein an upper surface of the via is in contact with the upper wiring filling layer.

2. The semiconductor device of claim 1, wherein the upper wiring barrier layer includes:
first portions disposed on a bottom surface of the upper wiring trench, and
second portions disposed on a side wall of the upper wiring trench and connected to the first portions, wherein
the upper wiring filling layer is in contact with the upper surface of the via between the first portions of the upper wiring barrier layer.

3. The semiconductor device of claim 2, wherein a width in a horizontal direction of the upper wiring filling layer disposed between the first portions of the upper wiring barrier layer is equal to a width in the horizontal direction of the upper surface of the via.

4. The semiconductor device of claim 2, wherein a width in a horizontal direction of the upper wiring filling layer disposed between the first portions of the upper wiring barrier layer differs from a width in the horizontal direction of the upper surface of the via.

5. The semiconductor device of claim 1, wherein the upper wiring pattern further includes an upper wiring capping pattern disposed on the upper wiring filling layer inside the upper wiring trench.

6. The semiconductor device of claim 1, wherein the via and the upper wiring filling layer include materials that differ from each other.

7. The semiconductor device of claim 1, wherein the upper surface of the via is coplanar with a bottom surface of the upper wiring trench.

8. The semiconductor device of claim 1, wherein the via is disposed in a part of the via trench, and
the upper wiring pattern is disposed in a remaining part of the via trench and inside the upper wiring trench.

9. The semiconductor device of claim 8, wherein at least a part of the upper wiring filling layer disposed in the remaining part of the via trench is in contact with the second interlayer insulating layer.

10. The semiconductor device of claim 1, wherein a side wall of the upper wiring filling layer is in contact with the second interlayer insulating layer.

11. A semiconductor device, comprising:
a substrate;
a first interlayer insulating layer disposed on the substrate;
a lower wiring pattern disposed inside the first interlayer insulating layer;
a second interlayer insulating layer disposed on the first interlayer insulating layer;
a via trench formed inside the second interlayer insulating layer, wherein the via trench extends to the lower wiring pattern;

a via that completely fills the via trench and is in contact with the second interlayer insulating layer;

an upper wiring trench formed inside the second interlayer insulating layer and on the via; and an upper wiring pattern disposed inside the upper wiring trench, wherein the upper wiring pattern includes an upper wiring barrier layer and an upper wiring filling layer disposed on the upper wiring barrier layer, wherein the via does not overlap the upper wiring barrier layer in a vertical direction.

12. The semiconductor device of claim 11, wherein an upper surface of the via is in contact with the upper wiring filling layer.

13. The semiconductor device of claim 11, wherein the upper wiring barrier layer includes:

first portions disposed on a bottom surface of the upper wiring trench, and second portions disposed on a side wall of the upper wiring trench and connected to the first portions, wherein a part of the upper wiring filling layer is disposed between the first portions of the upper wiring barrier layer.

14. The semiconductor device of claim 11, wherein the via is formed of a single film.

15. The semiconductor device of claim 11, wherein the via and the upper wiring filling layer include materials that differ from each other.

16. The semiconductor device of claim 11, wherein an upper surface of the via is higher than a bottom surface of the upper wiring trench.

* * * * *